(12) United States Patent
Hattori et al.

(10) Patent No.: US 7,194,724 B2
(45) Date of Patent: Mar. 20, 2007

(54) HIGH LEVEL SYNTHESIS METHOD AND HIGH LEVEL SYNTHESIS APPARATUS

(75) Inventors: Dai Hattori, Otsu (JP); Osamu Ogawa, Neyagawa (JP); Keiichi Kurokawa, Takarazuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 297 days.

(21) Appl. No.: 10/991,052

(22) Filed: Nov. 16, 2004

(65) Prior Publication Data

US 2005/0125762 A1 Jun. 9, 2005

(30) Foreign Application Priority Data

Dec. 5, 2003 (JP) .............................. 2003-408223

(51) Int. Cl.
*G06F 17/50* (2006.01)

(52) U.S. Cl. ....................................................... 716/18

(58) Field of Classification Search ...................... None
See application file for complete search history.

(56) References Cited

U.S. PATENT DOCUMENTS 6,611,952 B1  8/2003  Prakash et al.
2003/0028854 A1  2/2003  Nishida et al.

FOREIGN PATENT DOCUMENTS

JP  5-101141  4/1993

*Primary Examiner*—Leigh M. Garbowski
(74) *Attorney, Agent, or Firm*—Hamre, Schumann, Mueller & Larson, P.C.

(57) ABSTRACT

First of all, the number of referencing of a variable described in a behavior level circuit is calculated. Next, a bit width of the variable is extracted, and a plurality of memories capable of data transferring of the extracted bit width are selected. Next, a sum of a frequency of memory access for each of the selected plurality of memories when the variable is allocated thereto is calculated based on the number of referencing and the bit width of the variable. After that, as a target for allocating the variable, a memory that minimizes the calculated sum of the frequency of the memory access is selected.

29 Claims, 39 Drawing Sheets

```
struct aaa{
          char      m1;
          char      m2;
};
struct aaa a[10];
int b[10];

for(i=0; i<10; i++) {
          a[i].m1=i*2;
}
for(i=0; i<10; i++) {
          a[i].m2=a[i].m1+1;
}
for(i=0; i<10; i++) {
          b[i]=a[i];
}
```
~11

FIG. 3A

| Variable name | Read | Write | Bit width |
|---|---|---|---|
| a.m1 | 10 | 10 | 8 |
| a.m2 | 0 | 10 | 8 |
| a | 10 | 0 | 16 |
| b | 0 | 10 | 32 |

FIG. 3B

| Selectable memory | "a" Bit width | "b" Bit width | Sum of frequency |
|---|---|---|---|
| A(M1, M3) | M1:8 | M3:32 | 50 |
| B(M2, M3) | M2:16 | M3:32 | 60 |

FIG. 3C

|  | Read | Write |
|---|---|---|
| BW(variable)<BW(memory) | 1 | 2 |
| BW(variable)=BW(memory) | 1 | 1 |
| BW(variable)>BW(memory) | BW(variable)/BW(memory) | BW(variable)/BW(memory) |

FIG. 4

```
struct aaa{
            char     m1;
            char     m2;
            char     m3;
            char     m4;
};
struct aaa a[10];
int b[10];
for(i=0;i<10;i++){
            a[i].m3=a[i].m1*2;
}
for(i=0;i<10;i++){
            a[i].m4=a[i].m2+1;
}
for(i=0;i<10;i++){
            b[i]=a[i];
}
```
~ 11

FIG. 7A

```
struct aaa1{
            char     m1;
            char     m2;
};
struct aaa2{
            char     m3;
            char     m4;
};
struct aaa1 a1[10];
struct aaa2 a2[10];
int b[10];
for(i=0;i<10;i++){
            a2[i].m3=a1[i].m1*2;
}
for(i=0;i<10;i++){
            a2[i].m4=a1[i].m2+1;
}
for(i=0;i<10;i++){
            b[i]=a1[i]<<16|a2[i];
}
```
~ 22

FIG. 7B

| Variable name | Read | Write | Bit width |
|---|---|---|---|
| a1.m1 | 10 | 0 | 8 |
| a1.m2 | 10 | 0 | 8 |
| a2.m3 | 0 | 10 | 8 |
| a2.m4 | 0 | 10 | 8 |
| a1 | 10 | 0 | 16 |
| a2 | 10 | 0 | 16 |
| b | 0 | 10 | 32 |

FIG. 8A

| Selectable memory | "a1" Bit width | "a2" Bit width | "b" Bit width | Sum of frequency |
|---|---|---|---|---|
| A(M11,M13,M15) | M11:8 | M13:8 | M15:32 | 40 |
| B(M11,M14,M15) | M11:8 | M14:16 | M15:32 | 50 |
| C(M12,M13,M15) | M12:16 | M13:8 | M15:32 | 40 |
| D(M12,M14,M15) | M12:16 | M14:16 | M15:32 | 50 |

FIG. 8B

| Selectable memory | "a" Bit width | "b" Bit width | Sum of frequency |
|---|---|---|---|
| A' | 8 | 32 | 80 |
| B' | 32 | 32 | 70 |

FIG. 8C

```
char a[20];
char b, c;

b=c=0;
for(i=0; i<20; i+=2) {
    b += a[i];
    c += a[i+1];
}
```
— 11

FIG. 11A

```
struct aaa{
    char m1;
    char m2;
}
struct aaa a[10];
struct aaa t;
char b, c;

b=c=0;
for(i=0; i<10; i++) {
    t=a[i];
    b += t.m1;
    c += t.m2;
}
```
— 32

FIG. 11B

| Variable name | Read | Write | Bit width |
|---|---|---|---|
| a | 20 | 0 | 8 |

| Selectable memory | "a" Bit width | Sum of frequency |
|---|---|---|
| A' | 8 | 20 |

FIG. 12A

| Variable name | Read | Write | Bit width |
|---|---|---|---|
| a | 10 | 0 | 16 |

| Selectable memory | "a" Bit width | Sum of frequency |
|---|---|---|
| A | 16 | 10 |

FIG. 12B

```
char a1[10], a2[10];
char b, c;

b=c=0;
for(i=0; i<10; i++) {
    b += a1[i];
    c += a2[i];
}
```

FIG. 13A

| Variable name | Read | Write | Bit width |
|---|---|---|---|
| a1 | 10 | 0 | 8 |
| a2 | 10 | 0 | 8 |

| Selectable memory | "a" Bit width | "b" Bit width | Sum of frequency |
|---|---|---|---|
| A(M21, M22) | M21:8 | M22:8 | 10 |

FIG. 13B

```
             11
char a[20][20];
char b,c,d,e;

b=c=d=e=0;
for(i=0;i<20;i+=2) {
    for(j=0;j<20;j++) {
        b += a[i][j];
        c += a[i+1][j];
    }
}
for(j=0;j<20;j+=2) {
    for(i=0;i<20;i++) {
        d += a[i][j];
        e += a[i][j+1];
    }
}
```

FIG. 15A

```
             35
struct aaa{
    char m1;
    char m2;
}
struct aaa a1[10][10], a2[10][10];
struct aaa t1,t2;
char b,c,d,e;

b=c=d=e=0;
for(i=0;i<10;i++) {
    for(j=0;j<10;j++) {
        t1=a1[i][j];
        t2=a2[i][j];
        b += t1.m1;
        b += t1.m2
        c += t2.m1;
        c += t2.m2;
    }
}
for(j=0;j<10;j++) {
    for(i=0;i<10;i++) {
        t1=a1[i][j];
        t2=a2[i][j];
        d += t1.m1;
        d += t2.m1;
        e += t1.m2
        e += t2.m2;
    }
}
```

FIG. 15B

| Variable name | Read | Write | Bit width |
|---|---|---|---|
| a | 800 | 0 | 8 |

| Selectable memory | "a" Bit width | Sum of frequency |
|---|---|---|
| A' | 8 | 800 |

FIG. 16A

| Variable name | Read | Write | Bit width |
|---|---|---|---|
| a1 | 200 | 0 | 16 |
| a2 | 200 | 0 | 16 |

| Selectable memory | "a1" Bit width | "a2" Bit width | Sum of frequency |
|---|---|---|---|
| A(M31, M32) | M31:16 | M32:16 | 200 |

```
char a[10];
int i;
for(i=0;i<9;i++){
    a[i+1]=a[i]*2;
}
```
~11

FIG. 18B

```
char a1[5],a2[5];
int i;
for(i=0;i<9;i++){
    if((i%2) = = 0){
        a2[i/2] = a1[i/2]*2;
    }
    else{
        a1[i/2+1] = a2[i/2]*2;
    }
}
```
~39

| Variable name | Read | Write | Bit width |
|---|---|---|---|
| a | 10 | 10 | 8 |

| Selectable memory | "a" Bit width | Sum of frequency |
|---|---|---|
| A' | 8 | 20 |

FIG. 20A

| Variable name | Read | Write | Bit width |
|---|---|---|---|
| a1 | 5 | 5 | 8 |
| a2 | 5 | 5 | 8 |

| Selectable memory | "a1" Bit width | "a2" Bit width | Sum of frequency |
|---|---|---|---|
| A | 8 | 8 | 10 |

FIG. 20B

```
struct aaa{
        char    m1;
        char    m2;
        char    m3;
        char    m4;
};
struct bbb{
        short   n1;
        short   n2;
};
struct aaa a[10];
struct bbb b[30];
int c;

for(i=0; i<10; i++) {
        a[i].m1=i*2;
        c += a[i];
}
for(i=0; i<30; i++) {
        b[i].n2=b[i].n1+1;
}
for(i=0; i<30; i++) {
        c += b[i];
}
```

FIG. 23A

| Variable name | Group | Read | Write | Bit width |
|---|---|---|---|---|
| a.m1 | - | 0 | 10 | 8 |
| a.m2 | - | 0 | 0 | 8 |
| a.m3 | - | 0 | 0 | 8 |
| a.m4 | - | 0 | 0 | 8 |
| a | g1 | 10 | 0 | 32 |
| b.n1 | - | 30 | 0 | 16 |
| b.n2 | - | 0 | 30 | 16 |
| b | g1 | 30 | 0 | 32 |

FIG. 23B

| Selectable memory | "a" Bit width | Sum of frequency |
|---|---|---|
| M41 | 8 | 290 |
| M42 | 16 | 160 |
| M43 | 32 | 150 |

FIG. 23C

```
struct aaa{
         char       m1;
         char       m2;
};
struct aaa a[10];
struct aaa b[10];
struct aaa c[10];

for(i=0; i<10; i++) {
         b[i].m1=i;
}
for(i=0; i<10; i++) {
         a[i].m1=b[i].m1*2+1;
}
for(i=0; i<9; i++) {
         a[i].m2=a[i+1].m1;
}
for(i=0; i<10; i++) {
         c[i] = a[i];
}
```
~11

FIG. 27A

| Variable name | Read | Write | Bit width |
|---|---|---|---|
| a.m1 | 9 | 10 | 8 |
| a.m2 | 0 | 9 | 8 |
| a | 10 | 0 | 16 |

FIG. 27B

| Memory | Bit width | The frequency 1 | The frequency 2 | The frequency 3 |
|---|---|---|---|---|
| M51 | 8 | 48 | 48 | 48 |
| M52 | 16 | 57 | 47 | 39 |

FIG. 27C

Before interchange

```
struct aaa a[10];
struct out_buf;
for(i=0;i<9;i++) {
            out_buf = a[i];
            out_buf.m2 = a[i+1].m1;
            a[i] = out_buf;
}
```
3rd for sentence

FIG. 28A

After interchange

```
struct aaa a[10];
struct in_buf,out_buf;

out_buf = a[0];
for(i=0;i<9;i++) {
            in_buf = a[i+1];
            out_buf.m2 = in_buf.m1;
            a[i] = out_buf;
            out_buf = in_buf;
}
```
3rd for sentence

FIG. 28B

|  | Read | Write | |
|---|---|---|---|
|  |  | Preceding reading | Writing |
| BW(variable)<BW(memory) | 1 | 1 | 1 |
| BW(variable)=BW(memory) | 1 | 1 | |
| BW(variable)>BW(memory) | BW(variable)/BW(memory) | BW(variable)/BW(memory) | |

FIG. 30

```
struct aaa{
          char      m1;
          char      m2;
          char      m3;
          char      m4;
};
struct aaa a[10];
for(i=0;i<10;i++){
          a[i].m3 = a[i].m1*2;
}
for(i=0;i<10;i++){
          a[i].m4 = a[i].m2+1;
}
for(i=0;i<10;i++){
          b += a[i];
}
```

FIG. 36A

| Variable name | Read | Write | Bit width |
|---|---|---|---|
| a.m1 | 10 | 0 | 8 |
| a.m2 | 10 | 0 | 8 |
| a.m3 | 0 | 10 | 8 |
| a.m4 | 0 | 10 | 8 |
| a | 10 | 0 | 32 |

FIG. 36B

| Selectable memory | Bit width | Number | Sum of frequency |
|---|---|---|---|
| M71 | 8 | 1 | 80 |
| M72 | 32 | 1 | 70 |

FIG. 36C

| Memory cell | Access time | Area |
|---|---|---|
| T1610 | 2.5ns | 9 |
| T1620 | 3.5ns | 7 |
| T3210 | 3.0ns | 8 |
| T3220 | 4.0ns | 6 |

FIG. 37

HIGH LEVEL SYNTHESIS METHOD AND HIGH LEVEL SYNTHESIS APPARATUS

BACKGROUND OF THE INVENTION

1. Field of the Invention

The present invention relates to a high level synthesis apparatus and a high level synthesis method for synthesizing a circuit of a register transfer level or a gate level from a circuit described in a behavior level.

2. Related Background Art

With the recent trend toward a larger scale of LSIs, the circuits have been designed using high level synthesis in order to shorten the time required for LSI design. In the high level synthesis, a circuit of a register transfer level or a gate level is synthesized from a circuit represented in behavior description having a high level of abstraction, such as algorithm.

Meanwhile, in the circuit design in which the circuit is described in a register transfer level and the logic synthesis is performed based on this circuit description, megacells such as memory do not become a target of the logic synthesis. Therefore, when the megacells such as memory are to be used, a designer for the circuit has to make an instance description directly in the circuit description of the register transfer level.

On the other hand, behavior description is performed in the circuit design using high level synthesis, and therefore megacells can be described with variables such as array variables and structure variables. As a result, the variables can be allocated for memory element resources such as a memory, a register file or a register when the high level synthesis is carried out.

In the conventional high level synthesis, the techniques for allocating variables to registers and the like include, for example, to use the left edge algorithm that is explained in *"HIGH-LEVEL SYNTHESIS, Introduction to Chip and System Design"* (edited by Gajski, Wu, Dutt and Lin, published by Kluwer Academic Publishers, U.S. 1992). According to the technique using the left edge algorithm, first of all, scheduling is performed for determining a cycle for carrying out various operations in behavior description, and the lifetime of variables is analyzed.

Thereafter, the variables are sorted in the order of the lifetime and are allocated to registers in turn so as to avoid the overlapping of the lifetime. For instance, in the case where the variable is an array variable, the respective array elements of the array variable are allocated individually to the registers in accordance with the afore-mentioned technique.

Furthermore, in the conventional high level synthesis, techniques for allocating variables to memories include, for example, the technique in which a designer designates an array variable to be allocated to an arbitrary memory, whereby the array variable is allocated beforehand to the memory prior to the execution of the scheduling for determining the order of executing operations. For instance, in a high level synthesis apparatus disclosed in JP H05(1993)-101141 A, a designer of a circuit uses a command for memory allocation so as to allocate arbitrary array variables described in a behavior level circuit to arbitrary memories.

In the afore-mentioned technique for allocating array variables to memories, however, the scheduling follows the allocation of the array variables to the memories, and therefore the scheduling is performed under constraints based on the memory to which the allocation is designated. For that reason, in the case where the allocation of the array variable to the memory is not optimum, there occurs a problem of a failure to obtain the optimum scheduling result.

For example, in the case of the array variable using a structure variable written in the C language, in the description of the behavior level circuit, there is a case where reference is made with respect to the structure variable as a whole and there is another case where reference is made with respect to a member variable included in the structure. These cases have different bit widths for transferring data because of the difference in the referencing method therebetween.

Furthermore, in the high level synthesis according to JP H05(1993)-101141 A, when a structure variable is allocated to a memory, a bit width for the data transfer of the memory is limited to one type per each memory. Therefore, it is difficult to allocate a memory having the optimum bit width for the data transfer for both cases of the reference being made with respect to the structure variable as a whole and the reference being made with respect to member variables alone.

Moreover, the constraints on the bit width of the data transfer in the allocated memory cause the frequency of memory access when the reference is made with respect to the structure variable as a whole and the frequency of memory access when the reference is made with respect to the member variable alone to be determined.

Therefore, when the frequency of memory access affects the result of the scheduling, the optimum scheduling result would not be obtained. In order to cope with such a problem, the high level synthesis is required to select a memory that becomes a target of allocation so as to avoid the influence on the scheduling result or so as to obtain the optimum frequency.

SUMMARY OF THE INVENTION

Therefore, with the foregoing in mind, it is an object of the present invention to provide a high level synthesis method and a high level synthesis apparatus that enable the selection of a memory having the optimum bit width depending on the operation described in a behavior level circuit and that optimizes the frequency of memory access.

In order to fulfill the above-stated object, a high level synthesis method of the present invention, by which a variable described in a behavior level circuit is allocated to a memory so as to generate a logic circuit, includes the steps of: (a) calculating the number of referencing of the variable in the behavior level circuit; (b) extracting a bit width of the variable and selecting a plurality of memories capable of data transferring of the extracted bit width; (c) calculating a sum of a frequency of memory access for each of the plurality of memories selected in the step (b) when the variable is allocated thereto, the calculation being performed based on the number of referencing and the bit width of the variable; and (d) selecting as a target for allocating the variable a memory that minimizes the sum of the frequency of memory access calculated in the step (c).

Furthermore, in order to fulfill the above-stated object, a high level synthesis apparatus of the present invention, which allocates a variable described in a behavior level circuit to a memory so as to generate a logic circuit, at least includes: a reference number calculation unit that calculates the number of referencing of the variable in the behavior level circuit; a bit width extraction unit that extracts a bit width of the variable and selects a plurality of memories capable of data transferring of the extracted bit width; and a memory selection unit that calculates a sum of a frequency of memory access for each of the selected plurality of memories when the variable is allocated thereto, the calculation being performed based on the number of referencing and the bit width of the variable, and selects as a target for allocation a memory that minimizes the calculated sum of the frequency of memory access.

Furthermore, the present invention may be a recording medium in which a program for embodying the above high level synthesis apparatus of the present invention is recorded. This program may be installed in a computer and be executed, whereby the high level synthesis method of the present invention can be implemented.

From these features, according to the high level synthesis apparatus and the high level synthesis method of the present invention, a memory having an optimum bit width depending on the operation described in a behavior level circuit can be selected and the frequency of memory access can be optimized.

BRIEF DESCRIPTION OF THE DRAWINGS

FIG. 3 shows a behavior level circuit used in Embodiment 1 and the frequency of memory access, wherein FIG. 3A shows an exemplary behavior level circuit, FIG. 3B shows the number of referencing and the bit widths of the variables described in the behavior level circuit, and FIG. 3C shows the bit widths of selectable memories and the sum of the frequency of memory access.

FIG. 4 shows a memory access cycle table that is used for the calculation of the frequency of memory access in a selected memory.

FIG. 7 shows an exemplary behavior level circuit used in Embodiment 2, wherein FIG. 7A shows the state prior to the separation of the variables, and FIG. 7B shows the state after the separation of the variables.

FIG. 8 indicates the sum of the frequency in the case where the separation of the variables is carried out and in the case where the separation of the variables is not carried out, wherein FIG. 8A shows the number of referencing and the bit widths of the variables in the case where the separation of the variables is carried out, FIG. 8B shows the bit widths and the sum of the frequency of the selectable memories in the case where the separation of the variables is carried out and FIG. 8C shows the bit width and the sum of the frequency of the selectable memories in the case where the separation of the variables is not carried out.

FIG. 11 shows an exemplary behavior level circuit used in Embodiment 3, wherein FIG. 11A shows the state prior to the variable integration and FIG. 11B shows the state after the variable integration.

FIG. 12 shows the bit width and the number of referencing of a variable and the bit width and the sum of the frequency of a selectable memory in the case where the variable integration is performed and in the case where the variable integration is not performed, wherein FIG. 12A shows the case where the variable integration is not performed, and FIG. 12B shows the case where the variable integration is performed.

FIG. 13 shows the behavior level circuit, the bit widths and the number of referencing of the variables and the bit width and the sum of the frequency of a selectable memory after the array variable is separated with array elements, wherein FIG. 13A shows the state of the behavior level circuit shown in FIG. 11A subjected to the variable separation, and FIG. 13B shows the bit widths and the number of referencing of the variables, and the bit width and the sum of the frequency of the selectable memory when the variable separation is performed.

FIG. 15 shows an exemplary behavior level circuit used in Embodiment 3, wherein FIG. 15A shows the state before the variable separation and the variable integration and FIG. 15B shows the state after the variable separation and the variable integration.

FIG. 16 shows the bit widths and the number of referencing of variables and shows the bit widths and the sum of the frequency of selectable memories in the case where the variable integration and the variable separation are performed and in the case where the variable integration and the variable separation are not performed, wherein FIG. 16A shows the case where the variable integration and the variable separation are not performed, and FIG. 16B shows the case where the variable integration and the variable separation are performed.

FIG. 18 shows an exemplary behavior level circuit used in Embodiment 3, wherein FIG. 18A shows the state before the variable separation and FIG. 18B shows the state after the variable separation.

FIG. 20 shows the bit widths and the number of referencing of variables and shows the bit widths and the sum of the frequency of selectable memories in the case where the variable separation is performed and in the case where the variable separation is not performed, wherein FIG. 20A shows the case where the variable separation is not performed, and FIG. 20B shows the case where the variable separation is performed.

FIG. 23 shows a behavior level circuit used in Embodiment 4, bit widths of variables and the frequency of memory access, wherein FIG. 23A shows an exemplary behavior level circuit, FIG. 23B shows the number of referencing and the bit widths of the variables described in the behavior level circuit shown in FIG. 23A and FIG. 23C shows the sum of the frequency of memory access for each selectable memory.

FIG. 27 shows a behavior level circuit used in Embodiment 5, bit widths of variables and the frequency of memory access, wherein FIG. 27A shows an exemplary behavior level circuit, FIG. 27B shows the number of referencing and the bit widths of the variables described in the behavior level circuit shown in FIG. 27A and FIG. 27C shows the sum of the frequency of memory access for each selectable memory.

FIG. 28 shows the execution order of the third for sentence in the behavior level circuit shown in FIG. 27A, wherein FIG. 28A shows the state prior to the interchanging of the execution order and FIG. 28B shows the state after the interchanging of the execution order.

FIG. 30 shows a memory access cycle table used in Embodiment 5.

FIG. 33 shows exemplary access patterns, wherein

FIG. 36 shows a behavior level circuit used in Embodiment 7, the bit widths of variables and the frequency of memory access, wherein FIG. 36A shows an exemplary behavior level circuit, FIG. 36B shows the number of referencing and the bit widths concerning the variables described in the behavior level circuit shown in FIG. 36A and FIG. 36C shows the sum of the frequency of memory access for each selectable memory.

FIG. 37 shows a list of the physical memory cells in which a 32-bit memory can be mounted.

DETAILED DESCRIPTION OF THE INVENTION

Figure 1:
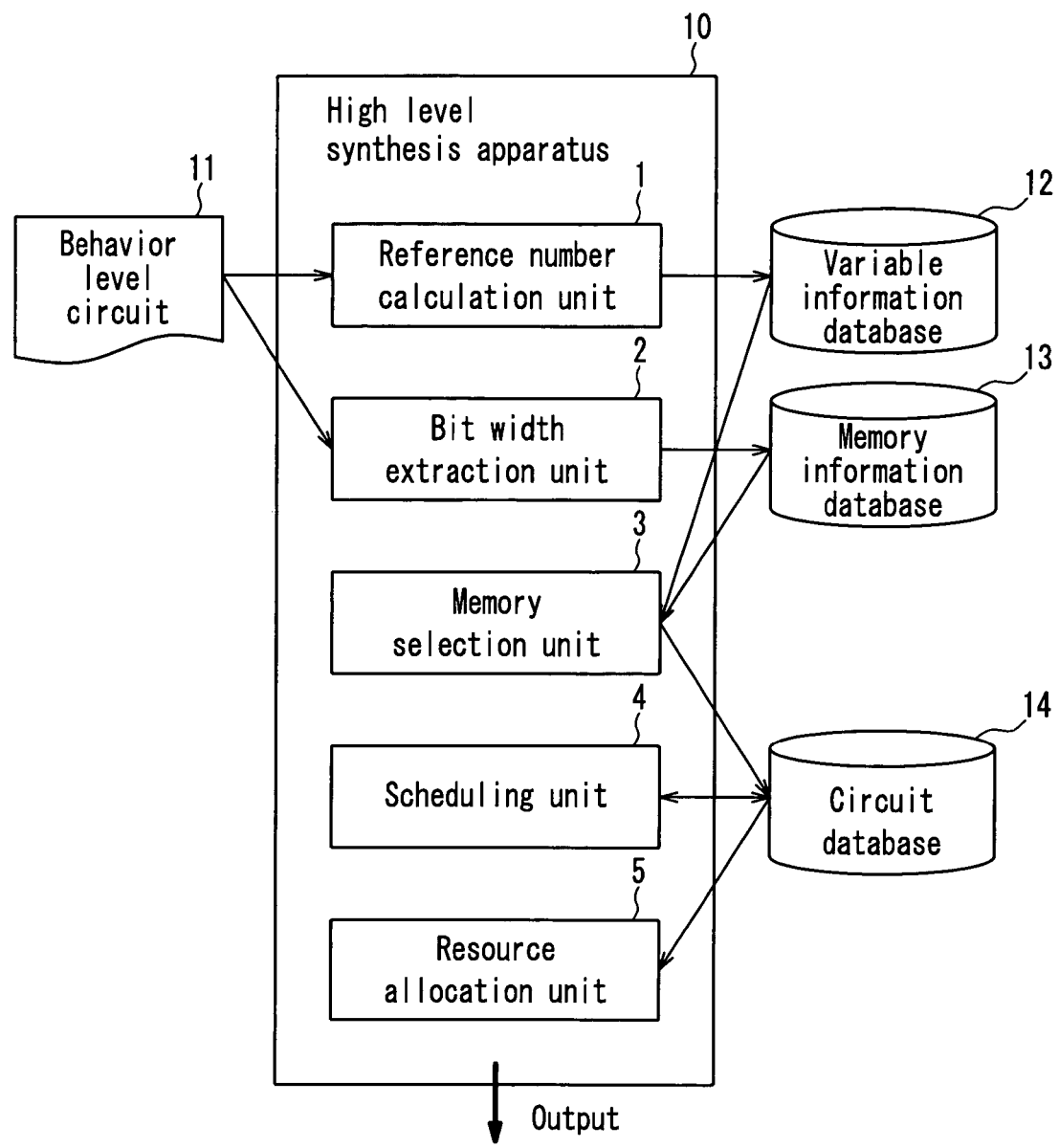
FIG. 1 is a block diagram schematically showing the structure of a high level synthesis apparatus according to Embodiment 1 of the present invention.

The afore-mentioned high level synthesis method of the present invention further may include the step of: integrating a plurality of variables included in a plurality of array variables or structure variables described in the behavior level circuit so as to generate a new variable. Herein, the steps (a) to (d) may be executed for the new variable.

Furthermore, the afore-mentioned high level synthesis method of the present invention may include the step of: separating an array variable or a structure variable described in the behavior level circuit so as to generate a new variable that is made up of a plurality of variables included in a resultant of the separation. Herein, the steps (a) to (d) may be executed for the new variable.

Furthermore, the afore-mentioned high level synthesis method may include the steps of: integrating a plurality of variables included in a plurality of array variables or structure variables described in the behavior level circuit so as to generate a new array variable or structure variable, and separating the new array variable or structure variable so as to generate a new variable that is made up of a plurality of variables included in a resultant of the separation. Herein, the steps (a) to (d) may be executed for the new variable.

In these embodiments, the plurality of variables may be variables described in the same section in the behavior level circuit, or the plurality of variables may be variables that are not described in the same section in the behavior level circuit.

In this case, the high level synthesis method further may include the steps of before executing the step (a), allocating all variables described in the behavior level circuit each to a different memory and performing scheduling of execution cycles in the behavior level circuit; and specifying an execution cycle in which the array variables or the structure variables are accessed based on a result of the scheduling, judging that variables that are accessed within a range of a predetermined frequency of an execution cycle are variables described in the same section and judging that variables that are not accessed within the range are variables that are not described in the same section.

Furthermore, the same section may be defined by a repetition processing in the behavior level circuit, and the method further may include the step of specifying variables described in the same section among a plurality of variables included in the same array variable or structure variable described in the behavior level circuit.

Furthermore, the afore-mentioned embodiments may include the steps of: performing dependency analysis concerning array variables or structure variables described in the behavior level circuit so as to calculate a distance vector between arbitrary variables out of the array variables or the structure variables, and specifying the plurality of variables based on the calculated distance vector.

Preferably, the afore-mentioned high level synthesis method of the present invention further may include the step of: setting a variable group made up of variables described in the behavior level circuit. In the step (b), a bit width of the variable group and a bit width of a variable that does not make up the variable group may be extracted, and the plurality of memories may be selected for each of the variable group and the variable that does not make up the variable group.

Furthermore, in this embodiment, the variables making up the variable group may be variables described in the same section in the behavior level circuit, or may be variables that are not described in the same section in the behavior level circuit.

Furthermore, in this case, it is preferable that the high level synthesis method further includes the steps of: before executing the step (a), allocating all variables described in the behavior level circuit each to a different memory and performing scheduling of execution cycles in the behavior level circuit; and specifying an execution cycle in which each of the variables is accessed based on a result of the scheduling, judging that variables that are accessed within a range of a predetermined frequency of an execution cycle are variables described in the same section and judging that variables that are not accessed within the range are variables that are not described in the same section.

Furthermore, in the afore-mentioned embodiment, the plurality of memories selected for the variable group each may have a different bit width, and the number of the variable groups that can be configured is set beforehand. Furthermore, a plurality of the variable groups may be configured, and the number of variables making up at least one variable group may be different from the number of variables making up another variable group.

Furthermore, preferably, the afore-mentioned high level synthesis method includes the step of: before executing the step (c), allocating the variable to the memory selected in the step (b) and performing scheduling of execution cycles in the behavior level circuit. In the step (c), a judgment may be made based on a result of the scheduling as to whether an operation processing that can be executed in parallel with the memory access is present or not, and if the operation processing is present, the sum of the frequency of memory access may be corrected.

Preferably, this embodiment further includes the steps of: extracting a repetition processing described in the behavior level circuit and analyzing a dependence of variables included in the repetition processing; and interchanging an execution order within the repetition processing based on a result of the analysis of the dependence so that the variables to be referred to at the same time can be executed in the same execution cycle.

Furthermore, preferably, the afore-mentioned high level synthesis method includes the steps of: before executing the step (c), allocating the variable to the memory selected in the step (b) and performing scheduling of execution cycles in the behavior level circuit; and after executing the step (d), displaying an access pattern to the selected memory, the access pattern being obtained from the scheduling.

In this embodiment, continuous accesses of a predetermined frequency or more to the same memory may be extracted from a result of the scheduling, and an access pattern showing the accesses may be displayed. Furthermore, a plurality of memories that are not accessed in the same execution cycle may be extracted from a result of the scheduling, and an access pattern showing an access condition to the extracted plurality of memories may be displayed.

Furthermore, preferably, the afore-mentioned high level synthesis method of the present invention includes the step of: specifying a plurality of memory cells corresponding to the selected memories and selecting among the plurality of memory cells a memory cell satisfying a predetermined condition on a delay time in one execution cycle. In the case where the memory cell satisfying the predetermined condition on a delay time in one execution cycle cannot be selected, the step (d) may be executed again.

This embodiment preferably further includes the step of allocating the variable to the selected memory and performing scheduling of execution cycles in the behavior level circuit. The selection of the memory cell may be performed by calculating a delay time in one execution cycle for each of the plurality of memory cells based on a result of the scheduling and an access time of each of the plurality of memory cells and by making a judgment as to whether the calculated delay time satisfies the predetermined condition or not.

Furthermore, the afore-mentioned high level synthesis method further may include the step of: after executing the step (d), allocating the variable to the selected memory and performing layout, whereby layout information specifying at least an arranged position of the selected memory and an arranged position of a circuit connected with the selected memory is generated. Herein, an access time of each of the plurality of memory cells may be determined from the layout information.

Furthermore, preferably, the afore-mentioned high level synthesis method of the present invention includes the steps of: after executing the step (d), allocating the variable to the selected memory and performing layout, whereby layout information specifying at least an arranged position of the selected memory and an arranged position of a circuit connected with the selected memory is generated; determining at least one of an access time of the selected memory, a congestion degree of routing and an area of a dead space based on the layout information; and in the case where the access time is determined, performing scheduling of execution cycles in the behavior level circuit using the access time.

Furthermore, preferably, this embodiment includes the step of: in the case where the congestion degree of the routing is determined, making a judgment as to whether the congestion degree of the routing satisfies a predetermined condition or not. Herein, if the congestion degree of the routing does not satisfy the predetermined condition, the step (d) may be executed again with respect to a memory other than the selected memory.

Furthermore, preferably, this embodiment includes the step of: in the case where the area of a dead space is determined, making a judgment as to whether the area of a dead space satisfies a predetermined condition or not. Herein, if the area of a dead space does not satisfy the predetermined condition, the step (d) may be executed again with respect to a memory other than the selected memory.

The following describes a high level synthesis apparatus and a high level synthesis method of the present invention, with reference to the drawings. Note here that the high level synthesis method and the high level synthesis apparatus of the present invention are not limited to the following embodiments.

(Embodiment 1)

The following describes a high level synthesis apparatus and a high level synthesis method according to Embodiment 1 of the present invention, with reference to FIGS. 1 to 4. Firstly, the structure of the high level synthesis apparatus of Embodiment 1 will be described below, with reference to FIG. 1. FIG. 1 is a block diagram schematically showing the structure of the high level synthesis apparatus according to Embodiment 1 of the present invention.

The high level synthesis apparatus 10 shown in FIG. 1 allocates variables to a memory, the variables being designated to be allocated to the memory among a plurality of variables described in a behavior level circuit 11, so as to generate a logic circuit.

As shown in FIG. 1, the high level synthesis apparatus 10 includes: a reference number calculation unit 1; a bit width extraction unit 2; a memory selection unit 3; a scheduling unit 4; and a resource allocation unit 5. The behavior level circuit 11 is a circuit represented in behavior description and the circuit is described in a hardware description language such as Verilog-HDL and in a programming language such as C language.

The reference number calculation unit 1 reads the behavior level circuit 11, specifies all variables that are designated to be allocated to memories among variables described in the behavior level circuit 11 and calculates the number of referencing for each variable. The number of referencing means the number of the times that each variable is referred to in the behavior level circuit 11. The calculated number of referencing is output to a variable information database 12 and is stored in the variable information database 12.

The bit width extraction unit 2 reads the behavior level circuit 11 and extracts the bit widths of all of the variables for each of which the number of referencing has been calculated by the reference number calculation unit 1, and then selects a plurality of memories that enable the data transfer of the extracted bit width. The bit width extraction unit 2 creates a list of the selected memories (selectable memory list) and outputs the same to a memory information database 13. The selectable memory list is stored in the memory information database 13.

Herein, the selectable memory list additionally includes identification information for identifying the selected memories (selectable memories) and information concerning bit widths of the memories. Furthermore, the bit width extraction unit 2 outputs information for specifying the extracted bit width for each variable also to the memory information database 13. The information for specifying the extracted bit width for each variable is stored in the memory information data base 13 so as to be associated with the selectable memories.

The memory selection unit 3 selects from the selectable memories a memory having a suitable bit width that becomes a target of the allocation for each variable designated to be allocated to memories. In Embodiment 1, the memory selection unit 3 accesses the memory information database 13 to acquire the selectable memory list and the bit widths of the variables and further accesses the variable information database 12 to acquire the number of referencing.

Furthermore, the memory selection unit 3 calculates the sum of the frequency of memory access in the case where the variable is allocated to the respective selectable memories based on the acquired information, while referring to a memory access cycle table shown in FIG. 4, which will be described later. Furthermore, the memory selection unit 3 compares the frequency of the respective selectable memories with one another and selects as a target of the allocation a memory that minimizes the calculated sum of the frequency.

As a result of this, a memory to which a variable in the behavior level circuit 11 is allocated, i.e., a memory in which a value of the variable is to be stored, is determined. Furthermore, the memory selection unit 3 outputs the behavior level circuit having the variables, with respect to which the memories for the allocation have been determined, to a circuit database 14.

More specifically, in Embodiment 1, the circuit database 14 stores control relationships and the relationships of operations and variables described in the behavior level circuit 11, which are represented by CDFG (Control Data Flow Graph), AST (Abstract Syntax Tree) or the like. For this purpose, the memory selection unit 3 adds to variables on the circuit database 14 the information (properties) of the memories to which the variables are allocated.

Note here that, in Embodiment 1, the control relationships and the relationships of operations and variables are represented by CDFG. The CDFG is a graph made up of Control Flow and Data Flow (input/output relationships of variables and operations) (See FIG. 29). Therefore, the memory selection unit 3 adds to variable nodes in the CDFG stored in the circuit database 14 the information (properties) on the memories to which the variables are allocated.

The scheduling unit 4 allocates the selected memories and performs the scheduling. More specifically, the scheduling unit 4 fetches a circuit (CDFG) for which allocation of a memory has been determined from the circuit database 14 and performs the scheduling with respect to the fetched circuit (CDFG) for determining the execution cycle of the operations. Furthermore, after the completion of the scheduling, the scheduling unit 4 outputs the circuit (CDFG) for which the execution cycle of the operations has been determined to the circuit database 14.

The resource allocation unit 5 fetches the circuit (CDFG) for which the execution cycle of the operations has been determined from the circuit database 14. Furthermore, based on this, the resource allocation unit 5 performs the allocation to resources such as resource allocation for each operation and register allocation except for memory allocation, and generates a logic circuit of a register transfer level or a gate level. The generated logic circuit is output to the outside. Note here that, in Embodiment 1, the scheduling unit 4 and the resource allocation unit 5 are configured to be capable of implementing the technique disclosed by the afore-mentioned "HIGH-LEVEL SYNTHESIS, Introduction to Chip and System Design".

Figure 2:
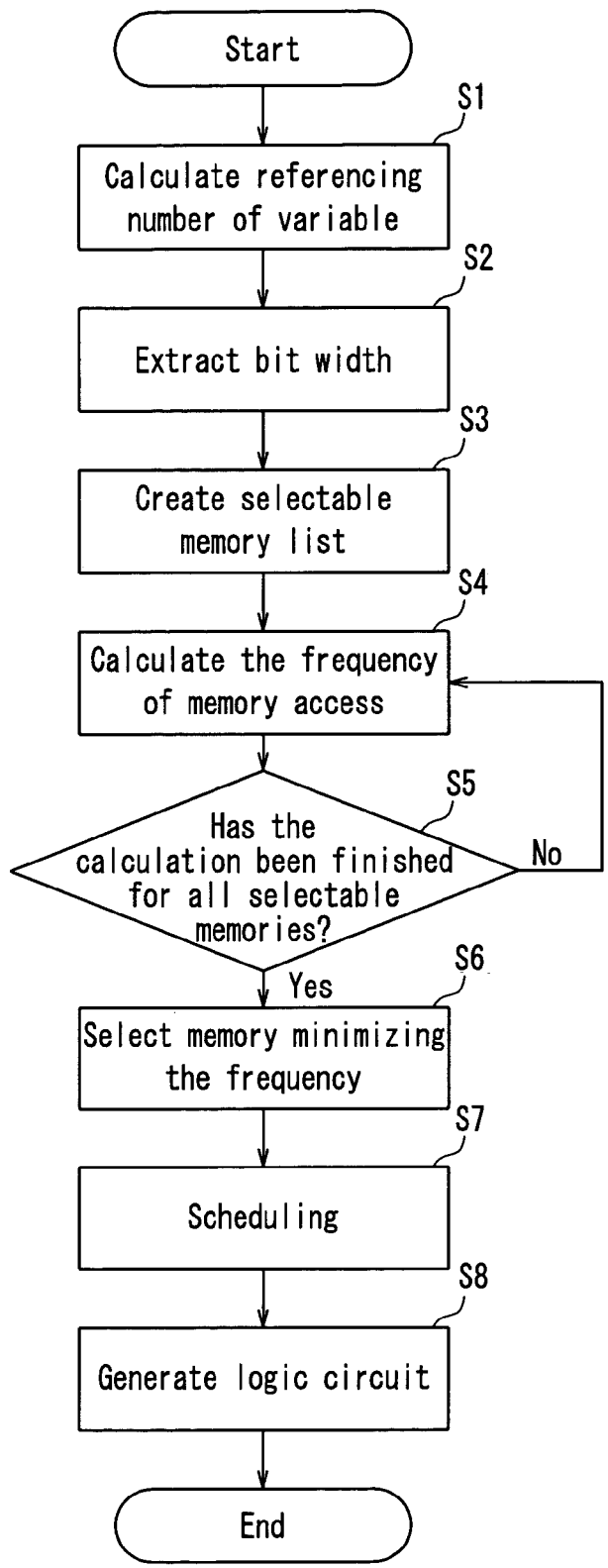
FIG. 2 is a flowchart showing a high level synthesis method according to Embodiment 1 of the present invention.

Next, the high level synthesis method according to Embodiment 1 will be described below, with reference to FIGS. 2 to 4. The high level synthesis method of Embodiment 1 can be implemented by operating the high level synthesis apparatus according to Embodiment 1 that is shown in FIG. 1. Therefore, the following describes the high level synthesis method based on the operations of the high level synthesis apparatus, while referring to FIG. 1 as needed. FIG. 2 is a flowchart showing the high level synthesis method according to Embodiment 1 of the present invention.

As shown in FIG. 2, first of all, the reference number calculation unit 1 specifies all variables that are designated to be allocated to memories among variables described in the behavior level circuit 11 and calculates the number of referencing for each variable (Step S1). The reference number calculation unit 1 outputs the calculated number of referencing to the variable information database 12.

Next, the bit width extraction unit 2 extracts the bit width of each variable for which the number of referencing has been calculated in Step S1 (Step S2). Furthermore, the bit width extraction unit 2 selects as selectable memories a plurality of memories that enable the data transfer of the extracted bit width, creates a selectable memory list that specifies the selectable memories and outputs the same to the memory information database 13 (Step S3).

Following this, based on the number of referencing calculated in Step S1 and the bit widths of the respective variables extracted in Step S2, the memory selection unit 3 calculates the sum of the frequency of memory access when the variables specified in Step S1 are allocated to the respective selectable memories (Step S4).

Thereafter, the memory selection unit 3 makes a judgment as to whether the sum of the frequency of memory access has been calculated for all of the selectable memories (Step S5). If the calculation of the sum of the frequency of memory access has not been finished for all of the selectable memories stored in the memory information database 13, the memory selection unit 3 executes Step S4 again. On the other hand, if the calculation of the sum of the frequency of memory access has been finished for all of the selectable memories, then the memory selection unit 3 executes Step S6.

In Step S6, the memory selection unit 3 compares the sums of the frequency of memory access for the respective selectable memories that are calculated in Step S4 with one another and selects as a target of the allocation a selectable memory that minimizes the sum of the frequency of memory access.

Furthermore, the memory selection unit 3 outputs the behavior level circuit having the variables, with respect to which the memories for the allocation have been determined, to the circuit database 14. In this way, by executing Steps S1 to S6, the allocation of the variables described in the behavior level circuit 11 to the memories can be finished.

Thereafter, the scheduling by the scheduling unit 4 (Step S7) and the allocation of resources by the resource allocation unit 5 are performed, whereby a logic circuit is generated (Step S8). The generated logic circuit is output to the outside.

Referring now to FIG. 3 and FIG. 4, Steps S1 to S6 in FIG. 2 will be described below more specifically. FIG. 3 shows the behavior level circuit used in Embodiment 1 and the frequency of memory access, wherein FIG. 3A shows an exemplary behavior level circuit, FIG. 3B shows the number of referencing and the bit widths of the variables described in the behavior level circuit, and FIG. 3C shows the bit widths of the selectable memories and the sum of the frequency of memory access. FIG. 4 shows a memory access cycle table that is used for the calculation of the frequency of memory access in a selected memory.

In the behavior level circuit shown in an example of FIG. 3A, array variables a and b are variables that are designated to be allocated to memories. Herein, although FIG. 3A shows the case where two variables are designated to be allocated to the memories, the number of the variables that are designated to be allocated to memories is not limited especially in the present invention.

Furthermore, in FIG. 3A, the array variable a is an array variable of a structure aaa including member variables m1 and m2. For instance, as for the member variable m1, there is a case where the reference is made with respect to the array variable a as a whole and there is another case where the reference is made with respect to the member variable m1 individually. In this way, this variable has two types of referencing methods.

Therefore, in Step S1, as shown in FIG. 3B, the reference number calculation unit 1 specifies, as the variables that are designated to be allocated to memories, the member variables a.m1 and a.m2 in addition to the array variables a and b.

Furthermore, as shown in FIG. 3B, the reference number calculation unit 1 calculates also the referencing number of the respective member variables a.m1 and a.m2 in addition to the referencing number of the array variables a and b ("Read" and "Write") from the behavior level circuit 11 shown in FIG. 3A.

In the behavior level circuit 11 shown in FIG. 3A, the data types of the member variables m1 and m2 are designated as char type. The char type represents that the bit width of the variables is 8-bit. Furthermore, the bit width of the array variable a equals the sum of the bit widths of all of the member variables included in the structure. Moreover, in the behavior level circuit 11 shown in FIG. 3A, the data type of the array variable b is designated as int type, and the int type represents that the bit width of the variable is 32-bit.

Therefore, in Step S2, as shown in FIG. 3B, the bit width extraction unit 2 extracts 8 bits as the bit width of the member variables a.m1 and a.m2, 16 bits as the bit width of the array variable a and 32 bits as the bit width of the array variable b.

Furthermore, in Step S3, the bit width extraction unit 2 determines the bit width of the memory to which the array variable a is to be allocated as 8 bits or 16 bits, and determines the bit width of the memory to which the array variable b is to be allocated as 32 bits.

Thereafter, as shown in FIG. 3C, the bit width extraction unit 2 selects memory M1 having the bit width of 8 bits and memory M2 having the bit width of 16 bits as memories to which the array variable a is to be allocated, and selects memory M3 having the bit width of 32 bits as a selectable memory for the array variable b.

Furthermore, the bit width extraction unit 2 creates a selectable memory list, where the combination of the memories M1 and M3 is a selectable memory A and the combination of the memories M2 and M3 is a selectable memory B, and outputs the selectable memory list. In FIG. 3C, "a bit width" indicates the bit width of the memory to which the array variable a is to be allocated, and "b bit width" indicates the bit width of the memory to which the array variable b is to be allocated.

In Step S4, the memory selection unit 3 refers to the memory access cycle table shown in FIG. 4 to calculate the sum of the frequency of memory access concerning the respective selectable memories. As shown in FIG. 4, the memory access cycle table shows the frequency of memory access carried out for the memories to which the variables are allocated, where the frequency is shown for each relationship in size between the bit width of the variables hereinafter abbreviated as "BW(variable)") and the bit width of the memories (hereinafter abbreviated as "BW(memory)") and for the reading (Read) and the writing (Write). The frequency of memory access shown in FIG. 4 indicates the number of memory access cycles required for referencing at one time of the variable.

More specifically, the memory selection unit 3 applies the relationship between BW(variable) and BW(memory) for the respective selectable memories to the memory access cycle table shown in FIG. 4 so as to calculate the frequency of memory access required for one referencing operation of the variable concerning the respective selectable memories, the calculation being conducted for each of the reading and the writing.

Furthermore, the memory selection unit 3 multiplies the thus calculated frequency of memory access by the reference number for the respective selectable memories so as to calculate the sum of the frequency of memory access. Note here that in the case where selectable memories include the combination of a plurality of memories, the above multiplication may be carried out for each combined memory and the sum of the values of the multiplication may be calculated.

For instance, the case where the variable a is to be allocated to the memory M1 (bit width: 8 bits) and the variable h is to be allocated to the memory M3 (bit width: 32 bits) will be described below. Since the bit width of the variable a.m1 and the bit width of the variable a.m2 both are 8 bits, they are equal to each other and BW(variable) becomes equal to BW(memory).

Therefore, from FIG. 4, the frequency of memory access becomes "1" for both of the reading and the writing. From FIG. 3B, the number of referencing of the variable a.m1 is "10" for both of the reading and writing. Thus, 10 cycles are needed for the reading and the writing of the variable a.m1, which means 20 cycles in total are required.

Similarly, as for the variable a.m2, 10 cycles are needed, and as for the variable a, 20 cycles are needed. From this, when the memory M1 is allocated for the variable a, the sum of the frequency of memory access becomes 50 cycles. Meanwhile, when the memory M3 is allocated for the variable h, 10 cycles in total are needed because the bit width of the memory is 32 bits.

Herein, since the memory M1 to which the array variable a is allocated and the memory M3 to which the array variable b is allocated are separate memories, the reading of the variable a and the writing of the variable b in the third "for" of FIG. 3A can be conducted concurrently. Therefore, when judging the selection of the memory in Step S5, the sum of the frequency of the memory M1 may be used (See FIG. 3C).

Next, the case where the variable a is to be allocated to the memory M2 (bit width: 16 bits) and the variable b is to be allocated to the memory M3 (bit width: 32 bits) will be described below. From FIG. 3B and FIG. 4, the sum of the frequency when the memory M2 is allocated for the variable a becomes 60 cycles. In this case also, the reading of the variable a and the writing of the variable b can be performed concurrently, so that the sum of the frequency of the memory M2 may be used when judging the selection of the memory in Step S5 (See FIG. 3C).

Note here that in FIG. 4 the writing cycle becomes 2 cycles when the bit width of the memory is larger than the bit width of the variable (BW(variable)<BW(memory)). This is because the data corresponding to the bit width for writing at one time should be read beforehand.

For instance, when the memory having the bit width of 16 bits is allocated for the variable a, the writing operation is performed in the unit of the variable a. Therefore, even when the writing is to be performed only for the member variable a.m1, the writing is performed for the member variable a.m2 also. For that reason, the writing should be performed after the data of the variable a is read beforehand, and therefore one cycle for reading and one cycle for writing, i.e., two cycles in total, are required.

In Step S6, based on the result shown in FIG. 3C, the memory selection unit 3 selects the memory M1 (bit width: 8 bits) as the allocation target of the variable a and the memory M3 (bit width: 32 bits) as the allocation target of the variable b.

Herein, in the behavior level circuit shown in FIG. 3A, the sum of the frequency becomes minimum when the memory having the bit width of 8 bits is selected. However, in the case where the reference is not made with respect to the member variables a.m1 and a.m2 individually, the frequency in total becomes minimum when the memory having the bit width of 32 bits is selected.

As stated above, according to Embodiment 1, a memory having an optimum bit width can be selected depending on the operations described in the behavior level circuit. Therefore, the frequency of memory access can be optimized.

For instance, in the case where variables having a plurality of variable referencing methods, such as structure variables in the C language, are to be allocated to memories, the memory that can minimize the frequency of memory access can be selected as the allocation target even when a plurality of memories having different bit widths are present as the allocation target. Therefore, unlike the conventional high level synthesis apparatus and high level synthesis method, Embodiment 1 allows the optimum scheduling result to be obtained.

The high level synthesis apparatus of Embodiment 1 can be implemented by installing a program that can embody Steps S1 to S8 of FIG. 2 into a computer and executing the program. In this case, a CPU (central processing unit) of the computer functions as the reference number calculation unit; the bit width extraction unit; the memory selection unit; the scheduling unit; and the resource allocation unit, and performs the corresponding processing.

Furthermore, in Embodiment 1, the variable information database 12, the memory information database 13 and the circuit database 14 can be implemented by storing a data file making up these databases into a storage device provided in a computer, such as a hard disk, or by installing a recording medium storing this data file in a reading apparatus connected with a computer. Furthermore, these databases may be implemented by a computer that is different from the computer constituting the reference number calculation unit 1 and the like. High level synthesis apparatuses in the following Embodiments 2 to 8 also can be implemented by a computer similarly to the high level synthesis apparatus of Embodiment 1.

(Embodiment 2)

Figure 5:
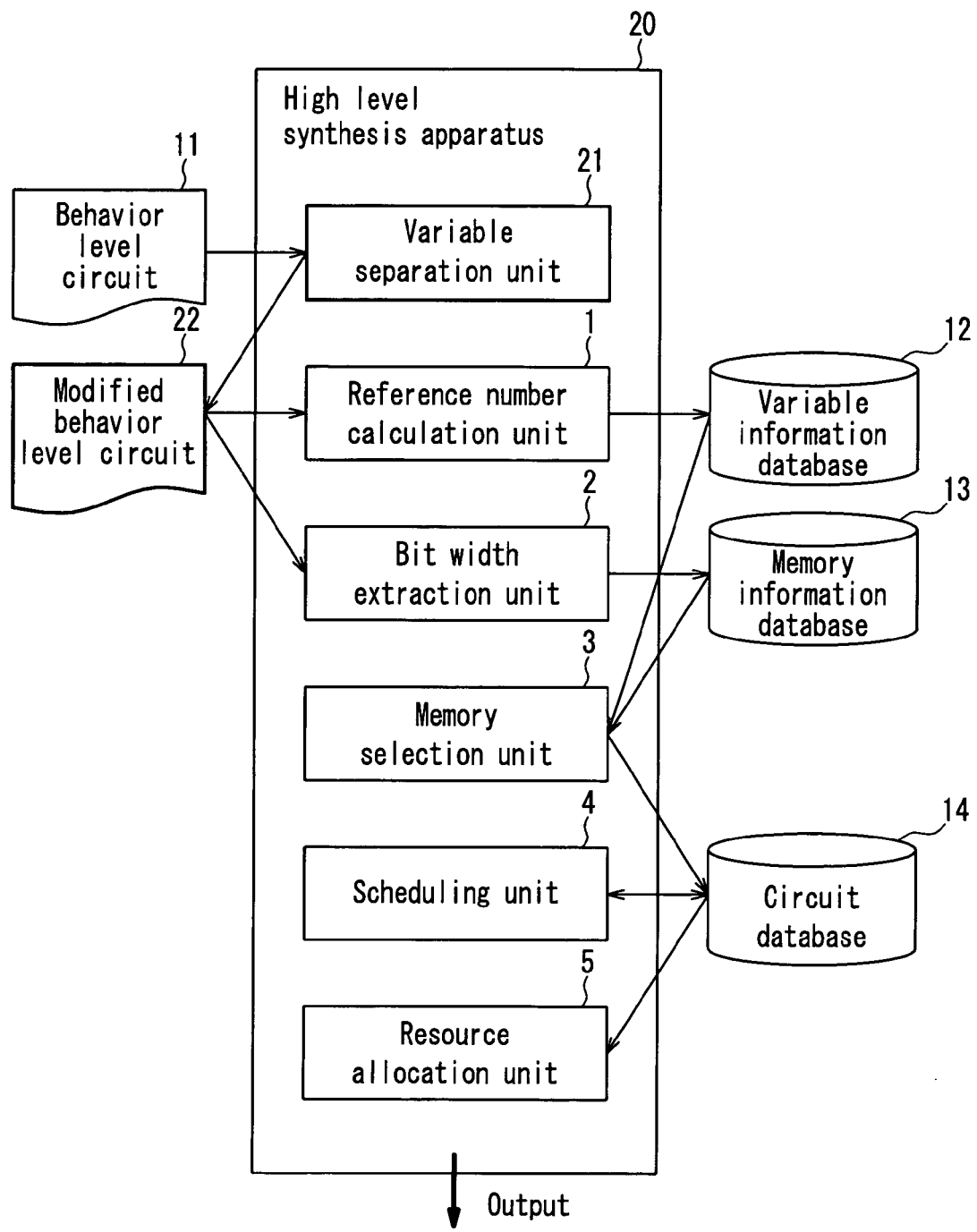
FIG. 5 is a block diagram schematically showing the structure of a high level synthesis apparatus according to Embodiment 2 of the present invention.

Referring now to FIGS. 5 to 9, a high level synthesis apparatus and a high level synthesis method according to Embodiment 2 of the present invention will be described below. Firstly, the structure of the high level synthesis apparatus according to Embodiment 2 will be described with reference to FIG. 5. FIG. 5 is a block diagram schematically showing the structure of the high level synthesis apparatus according to Embodiment 2 of the present invention.

As shown in FIG. 5, the high level synthesis apparatus 20 of Embodiment 2 includes a variable separation unit 21, which is a difference from the high level synthesis apparatus 10 of Embodiment 1 shown in FIG. 1. The remaining structure of the high level synthesis apparatus 20 of Embodiment 2 is similar to the high level synthesis apparatus 10 of Embodiment 1 shown in FIG. 1.

The variable separation unit 21 separates a variable described in the behavior level circuit 11 into a plurality of variables so as to generate new variables. Using these new variables, the variable separation unit 21 modifies the behavior level circuit 11. Furthermore, unlike Embodiment 1, a reference number calculation unit 1 and a bit width extraction unit 2 of Embodiment 2 reads a behavior level circuit 22 modified by the variable separation unit 21 (hereinafter called "modified behavior level circuit") to continue the processing.

The variable separation performed by the variable separation unit 21 will be described below. In Embodiment 2, there are two methods for separating variables by the variable separation unit 21, including an access concentration method and an access distribution method.

According to the access concentration method, a plurality of variables included in the same array variable or structure variable in the behavior level circuit 11 that are described in the same section are allocated to another one array variable or structure variable, and a plurality of variables that are not described in the same section are each allocated to a different array variable or structure variable. According to the access distribution method, a plurality of variables included in the same array variable or structure variable in the behavior level circuit 11 that are described in the same section are each allocated to a different array variable or structure variable.

For instance, when a structure variable is separated by the access concentration method so that a plurality of member variables described in the same section are allocated to one memory and a plurality of member variables not described in the same section are each allocated to a different memory, the access to the memories is concentrated to one memory for a constant time period, thus allowing other non-operating memories to suspend during the time period.

On the other hand, when a structure variable is separated by the access distribution method, the access may be conducted to different memories for a constant time period, thus allowing the concurrent access to different memories and decreasing the frequency of memory access.

In this way, different effects are obtained according to the separation methods of the variables, and the variable separation unit 21 may designate a separation method in accordance with the effects required for LSIs as a final product.

Figure 6:
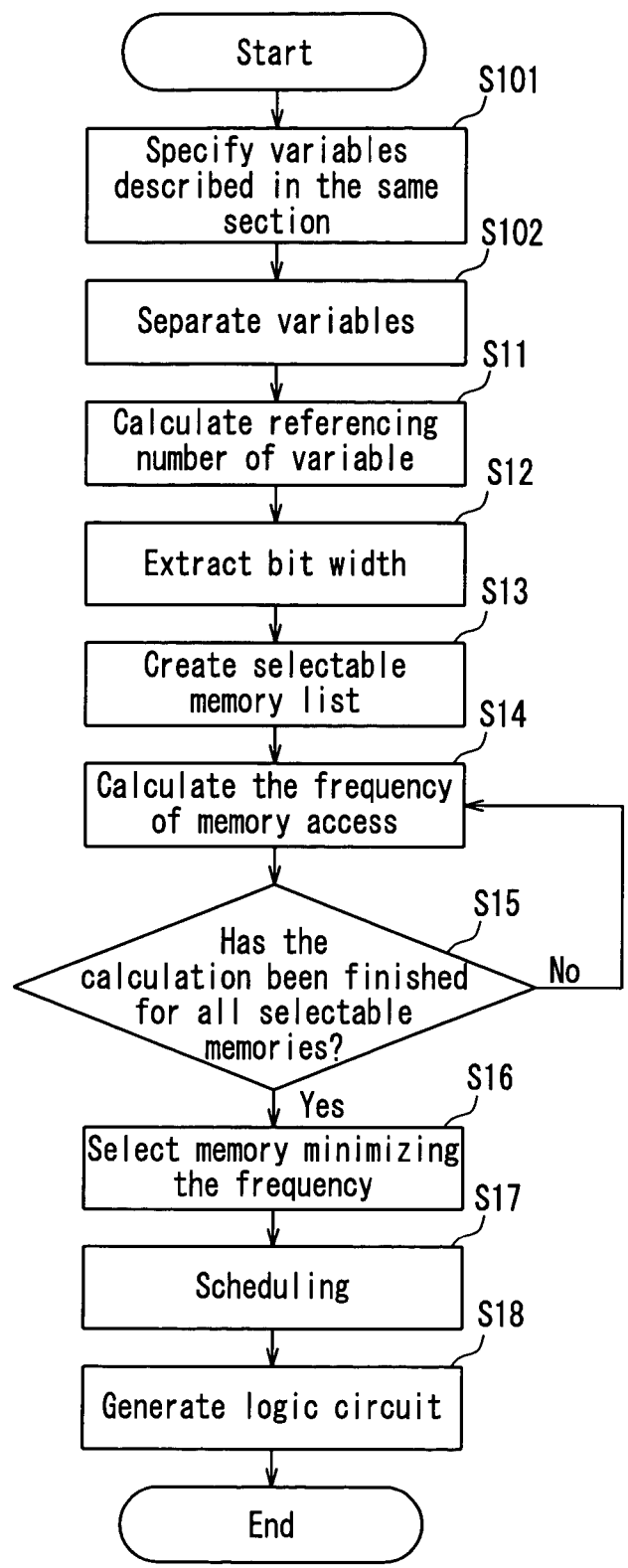
FIG. 6 is a flowchart showing a high level synthesis method according to Embodiment 2 of the present invention.

Referring now to FIGS. 6 to 8, the high level synthesis method of Embodiment 2 will be described below. The high level synthesis method according to Embodiment 2 can be implemented by operating the high level synthesis apparatus of Embodiment 2 shown in FIG. 5. Therefore, the high level synthesis method will be described below based on the operations of the high level synthesis apparatus, while referring to FIG. 5 as needed.

FIG. 6 is a flowchart showing the high level synthesis method according to Embodiment 2 of the present invention. FIG. 7 shows an exemplary behavior level circuit used in Embodiment 2, wherein FIG. 7A shows the state prior to the separation of the variables, and FIG. 7B shows the state after the separation of the variables.

FIG. 8 indicates the sum of the frequency in the case where the separation of the variables is carried out and in the case where the separation of the variables is not carried out. FIG. 8A shows the number of referencing and the bit widths of the variables in the case where the separation of the variables is carried out, and FIG. 8B shows the bit widths and the sum of the frequency of the selectable memories in the case where the separation of the variables is carried out. FIG. 8C shows the bit widths and the sum of the frequency of the selectable memories in the case where the separation of the variables is not carried out.

As shown in FIG. 6, first of all, the variable separation unit 21 specifies variables that are described in the same section among a plurality of variables included in an array variable or a structure variable described in the behavior level circuit 11 (Step S101).

More specifically, in the case where the behavior level circuit 11 is as shown in FIG. 7A, the variable separation unit 21 specifies variables described in the same section among the plurality of member variables (a.m1, a.m2, a.m3, a.m4) included in the structure variable aaa.

In Embodiment 2, the section specified by a repetition process is regarded as the same section, and a judgment as to whether the variables are described in the same section or not is based on whether the variables are described in one for sentence or not. Thus, a.m1 and a.m3 are judged to be described in the same section and a.m2 and a.m4 also are judged to be described in the same section.

Following this, the variable separation unit 21 separates the array variable or the structure variable described in the behavior level circuit 11, and generates new variables made up of the variables included in a resultant of the separation (Step S102). Furthermore, the variable separation unit 21 creates a modified behavior level circuit 22 in which the new variables are described (See FIG. 7B).

In Embodiment 2, the variable separation unit 21 separates a structure variable and generates new structure variables made up of the member variables included in a resultant of the separation. Furthermore, the variable separation unit 21 separates the variables by the access distribution method, so that the respective member variables making up the new variables are not described in the same section.

More specifically, as shown in FIG. 7B, the variable separation unit 21 separates the structure variable aaa and generates a structure variable aaa1 made up of a.m1 and a.m2 that are not described in the same section and a structure variable aaa2 made up of a.m3 and a.m4 that are not described in the same section.

Next, the reference number calculation unit 1 reads the modified behavior level circuit 22. Then, the reference number calculation unit 1 specifies all variables that are designated to be allocated to memories and calculates the number of referencing for the respective variables (Step S11).

Step S11 is performed similarly to Step S1 of Embodiment 1 except that the modified behavior level circuit 22 is read. Furthermore, as shown in the second column and the third column of the table of FIG. 8A, the number of referencing of the member variables a1.m1 and a1.m2 of the structure aaa1 and of the member variables a2.m3 and a2.m4 of the structure aaa2 also are calculated, as well as the number of referencing of the array variables a1, a2 and b.

Following this, the bit width extraction unit 2 reads the modified behavior level circuit 22 and extracts the bit widths of the variables for which the number of referencing has been calculated in Step S11 (Step S12) as shown in the fourth column of the table of FIG. 8A. Step S12 is performed similarly to Step S2 of Embodiment 1 except that the bit width extraction unit 2 reads the modified behavior level circuit 22.

Furthermore, the bit width extraction unit 2 selects memories as selectable memories, and creates a selectable memory list specifying the selectable memories (Step S13). Moreover, the bit width extraction unit 2 outputs the selectable memory list to the memory information database 13.

In Embodiment 2, the bit width extraction unit 2 selects memory M11 (8 bits) and memory M12 (16 bits) as memories for the allocation of the array variable a1, selects memory M13 (8 bits) and memory M14 (16 bits) as memories for the allocation of the array variable a2, and selects memory M15 (32 bits) as a memory for the allocation of the array variable b.

Furthermore, the bit width extraction unit 2 creates and outputs the selectable memory list so as to designate the combination of memories M11, M13 and M15 as selectable memory A, the combination of memories M12, M14 and M15 as selectable memory B, the combination of memories M12, M13 and M15 as selectable memory C, and the combination of memories M12, M14 and M15 as selectable memory D.

Following this, similarly to Step S4 of Embodiment 1, the memory selection unit 3 refers to the cycle table shown in FIG. 4 and calculates the sum of the frequency of memory access as shown in the fourth column of FIG. 8B (Step S14).

Note here that, in Embodiment 2 also, the memory to which the array variable a1 is allocated, the memory to which the array variable a2 is allocated, and the memory to which the array variable b is allocated are separate memories. Therefore, the reading and the writing with respect to the respective array variables can be performed concurrently in the "for" shown in FIG. 7B. Accordingly, the largest sum of the frequency of the array variable is filled in the fields of the "total of the frequency" for memory access shown in FIG. 8C.

Thereafter, similarly to Step S5 of Embodiment 1, the memory selection unit 3 makes a judgment as to whether the sum of the frequency of memory access has been calculated for all of the selectable memories (Step S15).

If the calculation of the sum of the frequency of memory access has not been finished for all of the selectable memories, the memory selection unit 3 executes Step S14 again. On the other hand, if the calculation has been finished for all of the selectable memories, then the memory selection unit 3 executes Step S16.

In Step S16, similarly to Step S6 of Embodiment 1, the memory selection unit 3 compares the sums of the frequency of the selectable memories A to D and selects as a target of the allocation a selectable memory that minimizes the sum of the frequency of memory access.

After that, similarly to Embodiment 1, the scheduling by the scheduling unit 4 (Step S17), the allocation of resources by the resource allocation unit 5 and the like are performed, whereby a logic circuit is generated (Step S18). The generated logic circuit is output to the outside.

The following examines the case where Steps S101 and S102 are not performed, which means the separation of the variables is not performed. In this case, selectable memories A' and B' are selected for the array variable a (See FIG. 7A) and the array variable b. The frequency of memory access in this case is as shown in FIG. 8C.

As can be seen from FIG. 8B and FIG. 8C, the case without the separation of variables requires at least 70 cycles, whereas the case with the separation of variables can decrease the frequency to 40 cycles. In this way, according to Embodiment 2, a structure variable can be separated and member variables described in the same section each can be allocated to a different memory, and therefore the frequency further can be reduced compared with Embodiment 1.

Although the variable separation unit 21 of Embodiment 2 separates the variable by the access distribution method as illustrated above, the variable can be separated by the access concentration method by which the variable is separated into a structure variable including a.m1 and a.m3 and a structure variable including a.m2 and a.m4 for example.

In this case, a.m1 and a.m3 are allocated to the same memory and a.m2 and a.m4 also are allocated to the same memory, and therefore a time period when each memory is not used can be increased. Therefore, the memories can be suspended during the time period, thus allowing the reduction of power consumption of LSI.

Although the same section in Embodiment 2 is designated as the section described with a for sentence, the same section is not limited to this. For example, a fundamental block in the behavior level circuit 11 or the modified behavior level circuit 22 can be defined as the same section.

Alternatively, the scheduling unit 4 may perform tentative scheduling that is different from the scheduling in Step S17, and a plurality of member variables that can be judged to be accessed in the same cycle from the result of this tentative scheduling can be defined as those described in the same section.

The following describes one embodiment in which the scheduling unit 4 performs the tentative scheduling. Even in the embodiment for tentative scheduling, the high level synthesis apparatus has the similar structure to that of FIG. 5. However, this apparatus is different from the high level synthesis apparatus shown in FIG. 5 in terms of the operations of the variable separation unit 21 (See FIG. 5) and the scheduling unit 4 (See FIG. 5). Thus, the steps for executing the high level synthesis method also are different from those shown in FIG. 6.

Figure 9:
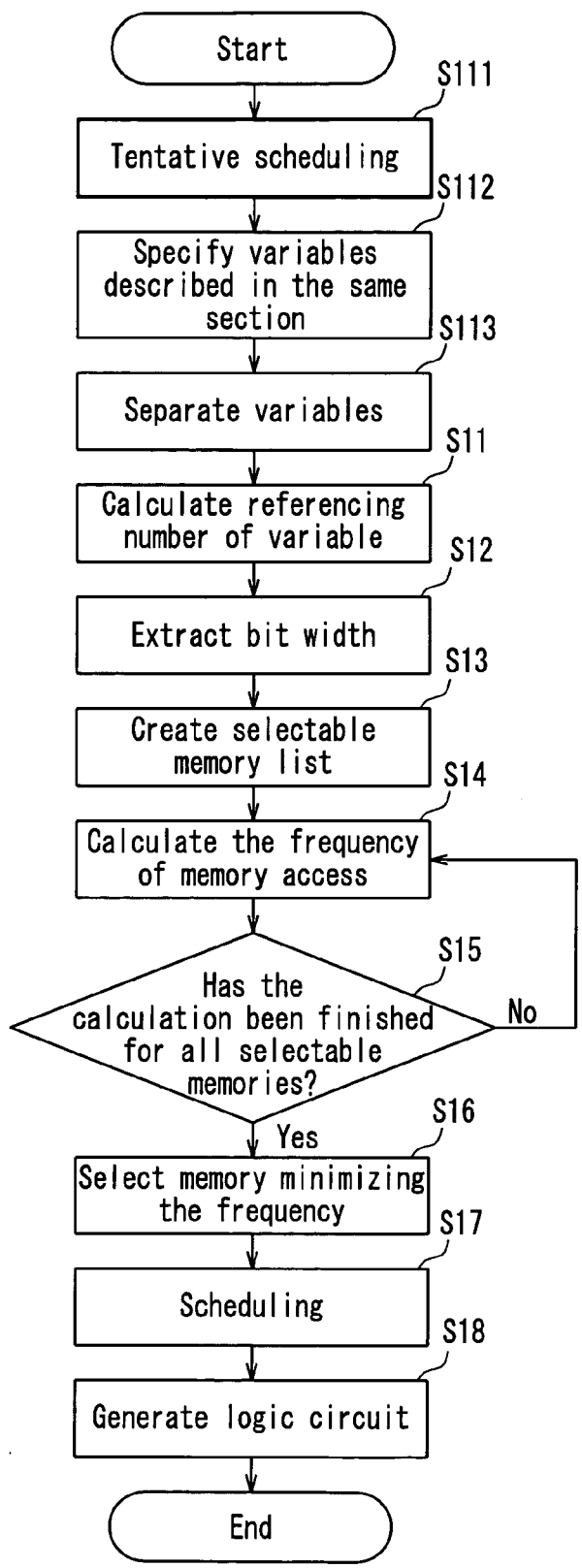
FIG. 9 is a flowchart showing a high level synthesis method of Embodiment 2 in which tentative scheduling is performed.

Referring now to FIG. 9, the high level synthesis method of Embodiment 2, in which the tentative scheduling is performed, will be described below. FIG. 9 is a flowchart of the high level synthesis method of Embodiment 2 in which the tentative scheduling is performed. The following description may refer to FIG. 5 also, as needed.

As shown in FIG. 9, first of all, the scheduling unit 4 performs the tentative scheduling (Step S111). More specifically, the scheduling unit 4 allocates all variables described in the behavior level circuit 11 each to a different memory so as to perform the scheduling of execution cycles of the behavior level circuit 11.

Next, the variable separation unit 21 specifies the variables described in the same section (Step S112). More specifically, first of all, the variable separation unit 21 specifies the execution cycle for accessing array variables or structure variables, based on the result of the tentative scheduling in Step S111. Furthermore, the variable separation unit 21 specifies the variables that are accessed within a range of a predetermined frequency of an execution cycle, thus making a judgment as to whether the variables are described in the same section or not.

For instance, in the case where the range of the frequency of the execution cycle is set at 3, if the execution cycle of "a[i].m1" shown in FIG. 7A is cycle 1 and the execution cycle of "a[i].m3" is cycle 3, then the access can be performed within the range of the frequency of 3. As a result, the variables are judged to be described in the same section.

Following this, based on the result of Step S112, the variable separation unit 21 separates the variables (Step S113). After that, similarly to the example of FIG. 6, Steps S11 to Step S18 are executed. In this embodiment also, the variables described in the same section can be allocated each to a different memory, and therefore the frequency further can be reduced compared with Embodiment 1.

(Embodiment 3)

Referring now to FIGS. 10 to 20, a high level synthesis apparatus and a high level synthesis method according to Embodiment 3 of the present invention will be described below.

The high level synthesis apparatus and the high level synthesis method according to Embodiment 3 enable not only the variable separation but also the integration of a plurality of variables (member variables and array elements) included in the same array variable or structure variable so as to generate new variables (variable integration). Furthermore, although the structure variable described in the behavior level circuit is separated with member variables in Embodiment 2, Embodiment 3 enables the separation of the array variable described in the behavior level circuit with array elements.

Figure 10:
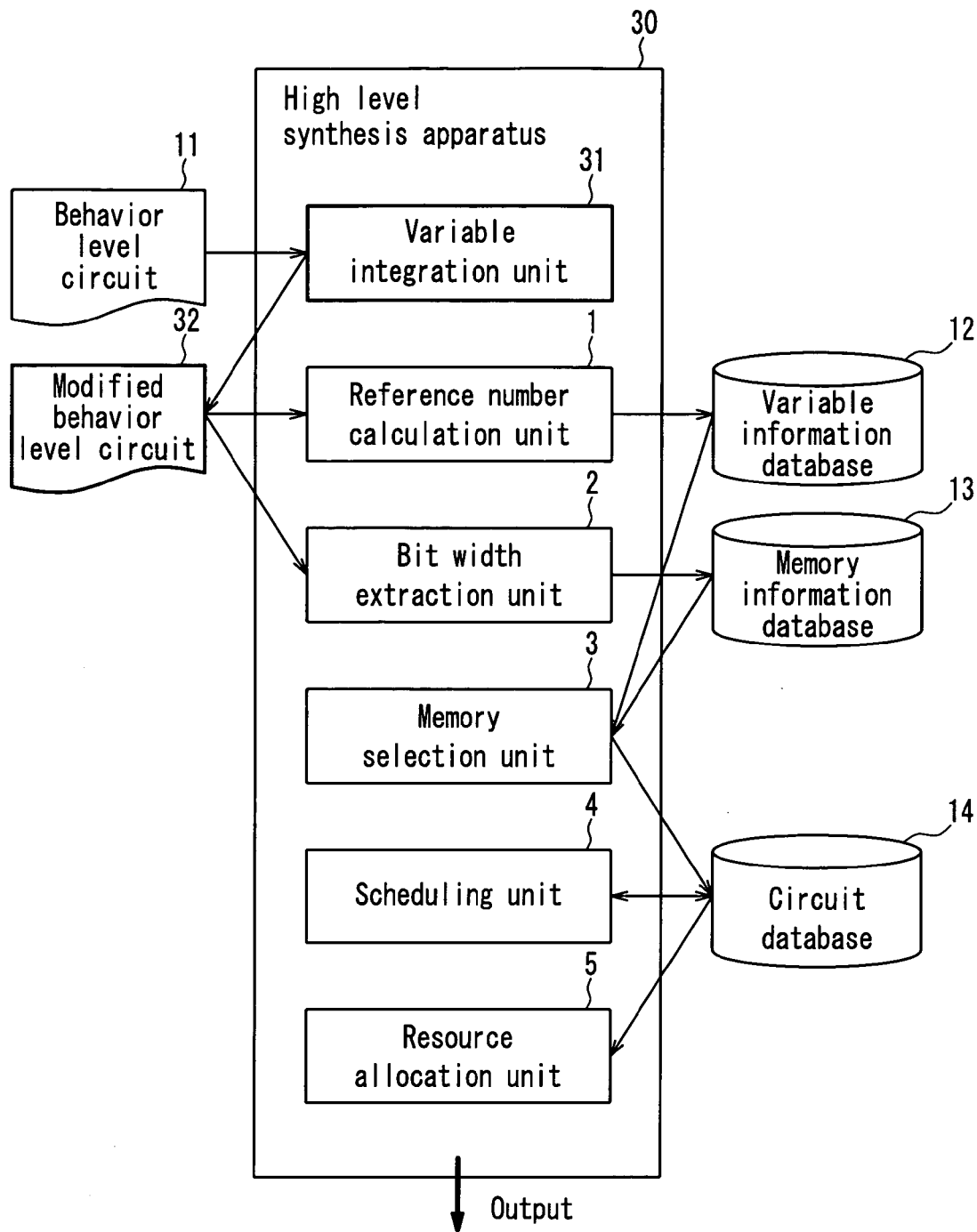
FIG. 10 is a block diagram schematically showing an exemplary structure of the high level synthesis apparatus according to Embodiment 3 of the present invention.

FIG. 10 is a block diagram schematically showing an exemplary structure of the high level synthesis apparatus according to Embodiment 3 of the present invention. FIG. 11 shows an exemplary behavior level circuit used in Embodiment 3, wherein FIG. 11A shows the state prior to the variable integration and FIG. 11B shows the state after the variable integration.

As shown in FIG. 10, the high level synthesis apparatus 30 includes a variable integration unit 31, which is a difference from the high level synthesis apparatus 20 of Embodiment 2 shown in FIG. 5. The remaining structure of the high level synthesis apparatus 30 is similar to the high level synthesis apparatus 20 shown in FIG. 5. The variable integration unit 31 integrates a plurality of variables included in a plurality of array variables or structure variables described in the behavior level circuit 11 so as to generate new variables. More specifically, the variable integration unit 31 integrates some of the plurality of array elements that are described in the behavior level circuit 11 and included in the same array variable to generate a new array variable.

For instance, in the behavior level circuit 11 shown in FIG. 11A, a[i] and a[i+1] that are array elements of the array variable a are described in the same for sentence, and therefore these elements may be accessed at one time. Therefore, as shown in FIG. 11B, the variable integration unit 31 integrates a[i] and a[i+1] to generate a new structure variable aaa.

When the high level synthesis method is executed by operating the high level synthesis apparatus 30 of FIG. 10, the variable integration is performed by the variable integration unit 31 instead of Step S102 of Embodiment 2 shown in FIG. 6. In that case, the reference number calculation unit 1 and the bit width extraction unit 2 read a modified behavior level circuit 32 subjected to the variable integration (See FIG. 11B). The other steps are performed similarly to the high level synthesis method of Embodiment 2.

FIG. 12 shows the bit widths and the number of referencing of variables and shows the bit widths and the sum of the frequency of selectable memories in the case where the variable integration is performed and in the case where the variable integration is not performed. FIG. 12A shows the case where the variable integration is not performed, and FIG. 12B shows the case where the variable integration is performed.

In the case where the variable integration unit 31 (See FIG. 10) performs the variable integration with respect to the behavior level circuit 11 (See FIG. 11A), a 16-bit memory (selectable memory A) can be allocated for the array variable a described in the modified behavior level circuit 32 (See FIG. 1B). In this case, as shown in FIG. 12B, the sum of the frequency of memory access becomes 10 cycles.

On the other hand, as shown in FIG. 12A, in the case where the variable integration is not performed with respect to the behavior level circuit 11 (See FIG. 11A) and a selectable memory A' is allocated, the frequency of memory access becomes 20 cycles in total, including 10 cycles of a[i] and 10 cycles of a[i+1]. Although an 8-bit memory is allocated for the array variable a in the example of FIG. 12A, even when a 16-bit memory is allocated instead of this memory, the frequency of memory access would be 20 cycles (See FIG. 4).

In this way, similarly to Embodiment 2, Embodiment 3 also allows further reduction of the frequency compared with Embodiment 1.

Furthermore, the high level synthesis apparatus 30 of Embodiment 3 shown in FIG. 10 may be provided with a variable separation unit that can separate the array variable a described in the behavior level circuit 11 shown in FIG. 11A with array elements, instead of the variable integration unit 31.

FIG. 13 shows the behavior level circuit, the bit widths and the number of referencing of the variables and the bit width and the sum of the frequency of a selectable memory after the array variable is separated with array elements, wherein FIG. 13A shows the state of the behavior level circuit shown in FIG. 11A subjected to the variable separation, and FIG. 13B shows the bit widths and the number of referencing of the variables, and the bit width and the sum of the frequency of the selectable memory when the variable separation is performed.

As shown in FIG. 13, when the array variable a shown in FIG. 11A is separated with the array elements so as to create array variables a1 and a2, the bit width of the created array variables each becomes 8 bits. Furthermore, each of the array variables can be allocated to 8-bit memory M21 or M22 (selectable memory A), and these memories can be accessed separately, and therefore the sum of the frequency of memory access becomes 10 cycles.

As can be seen from FIG. 13, similarly to the case of the variable integration, this embodiment also can reduce the frequency and further can reduce the frequency compared with Embodiment 1.

Figure 14:
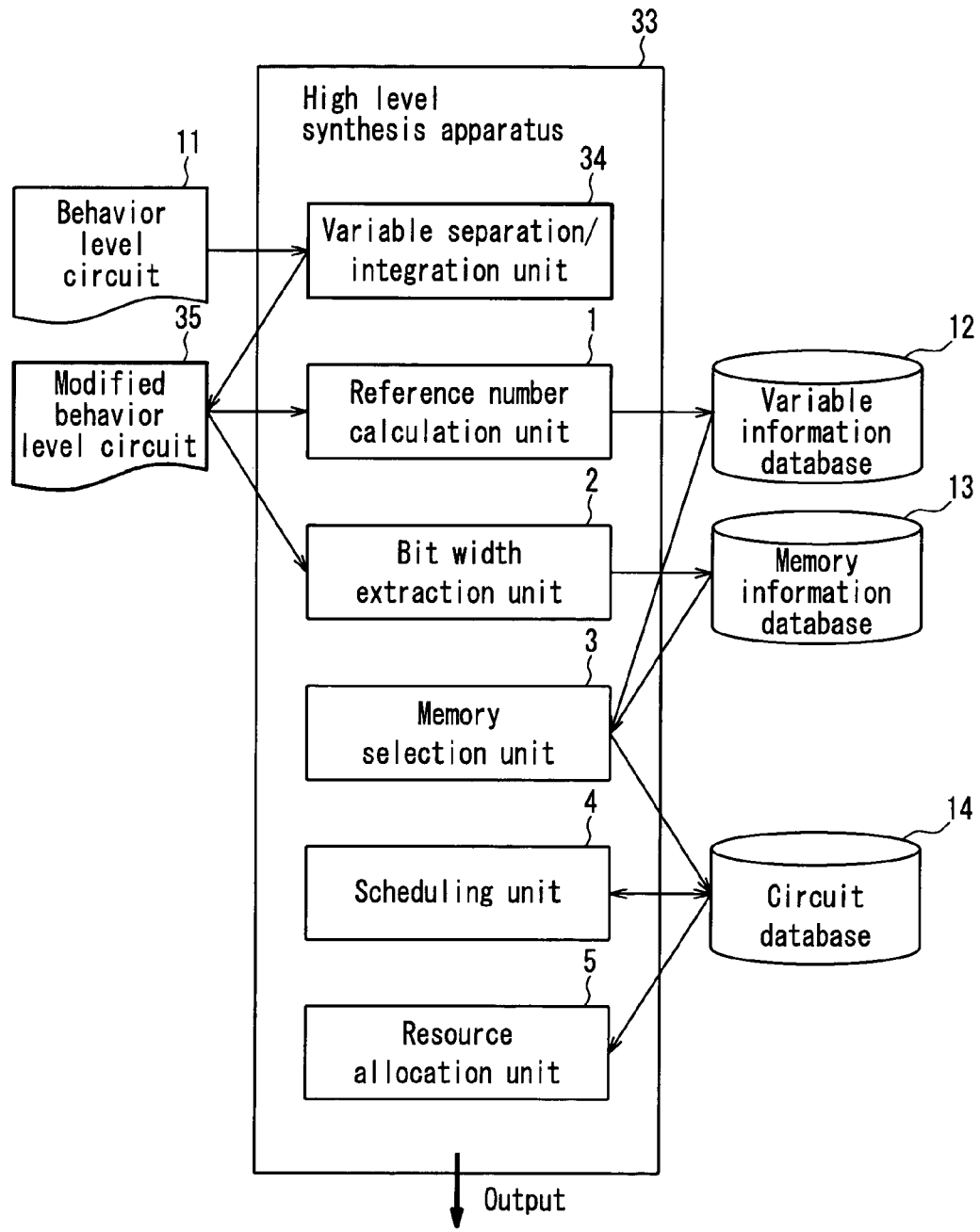
FIG. 14 is a block diagram schematically showing another exemplary structure of the high level synthesis apparatus according to Embodiment 3 of the present invention.

The following describes another exemplary high level synthesis apparatus and high level synthesis method according to Embodiment 3. FIG. 14 is a block diagram schematically showing the structure of this high level synthesis apparatus according to Embodiment 3 of the present invention. FIG. 15 shows an exemplary behavior level circuit used in Embodiment 3, wherein FIG. 15A shows the state before the variable separation and the variable integration and FIG. 15B shows the state after the variable separation and the variable integration.

As shown in FIG. 14, the high level synthesis apparatus 33 has a variable separation/integration unit 34, which is a difference from the high level synthesis apparatus 20 of Embodiment 2 shown in FIG. 5. The remaining structure of the high level synthesis apparatus 33 is similar to that of the high level synthesis apparatus 20 shown in FIG. 5. The variable separation/integration unit 34 firstly integrates a plurality of variables included in a plurality of array variables or structure variables described in the behavior level circuit 11 to generate new array variables or structure variables. Furthermore, the variable separation/integration unit 43 separates these new array variables or structure variables to generate new variables made up of a plurality of variables included in a resultant of the separation. That is, the separation/integration unit 34 enables the variable separation and the variable integration.

In Embodiment 3, the variable separation/integration unit 34 integrates a plurality of array elements included in a second-order array variable a (See FIG. 15A) to generate a new array variable (not illustrated), and furthermore separates this new array variable to generate new array variables a1 and a2 made up of array elements included in a resultant of the separation (See FIG. 15B).

In the case where the high level synthesis method is implemented by operating the high level synthesis apparatus 33 shown in FIG. 14, the variable integration and the variable separation may be performed by the variable separation/integration unit 34, instead of Step S102 of Embodiment 2 shown in FIG. 6. In this case, the reference number calculation unit 1 and the bit width extraction unit 2 read a modified behavior level circuit 35 (See FIG. 15B) subjected to the variable integration and the variable separation. The other steps are performed similarly to the high level synthesis method of Embodiment 2.

According to such an embodiment enabling both of the variable integration and the variable separation, in the case of the behavior level circuit shown in FIG. 15A in which a second or higher-order array variable and a plurality of repetition loops that are different in the order of accessing to this array variable are described, duplicated processing performed in the respective repetition loops can be omitted, thus reducing the frequency.

FIG. 16 shows the bit widths and the number of referencing of variables and shows the bit widths and the sum of the frequency of selectable memories in the case where the variable integration and the variable separation are performed and in the case where the variable integration and the variable separation are not performed. FIG. 16A shows the case where the variable integration and the variable separation are not performed, and FIG. 16B shows the case where the variable integration and the variable separation are performed.

As shown in FIG. 16B, in the case where the variable separation/integration unit 34 (See FIG. 14) performs the variable integration and the variable separation with respect to the behavior level circuit 11 (See FIG. 14 and FIG. 15A), 16-bit memory M31 or M32 (selectable memory A) can be allocated for the array variables a1 and a2 described in the modified behavior level circuit 35 (See FIG. 15B). These memories can be accessed separately, and therefore, in this case, the sum of the frequency of memory access becomes 200 cycles.

On the other hand, as shown in FIG. 16A, in the case where the variable integration and the variable separation are not performed with respect to the behavior level circuit 11 (See FIG. 11A), the array variable a is allocated to one 8-bit memory (selectable memory A), and therefore the sum of the frequency of memory access becomes 800 cycles. Although a 8-bit memory is allocated for the array variable a in the example of FIG. 16A, even when a 16-bit memory is allocated instead of this memory, the frequency of memory access would be 800 cycles (See FIG. 4).

In this way, similarly to Embodiment 2, this embodiment also allows further reduction of the frequency compared with Embodiment 1.

Figure 17:
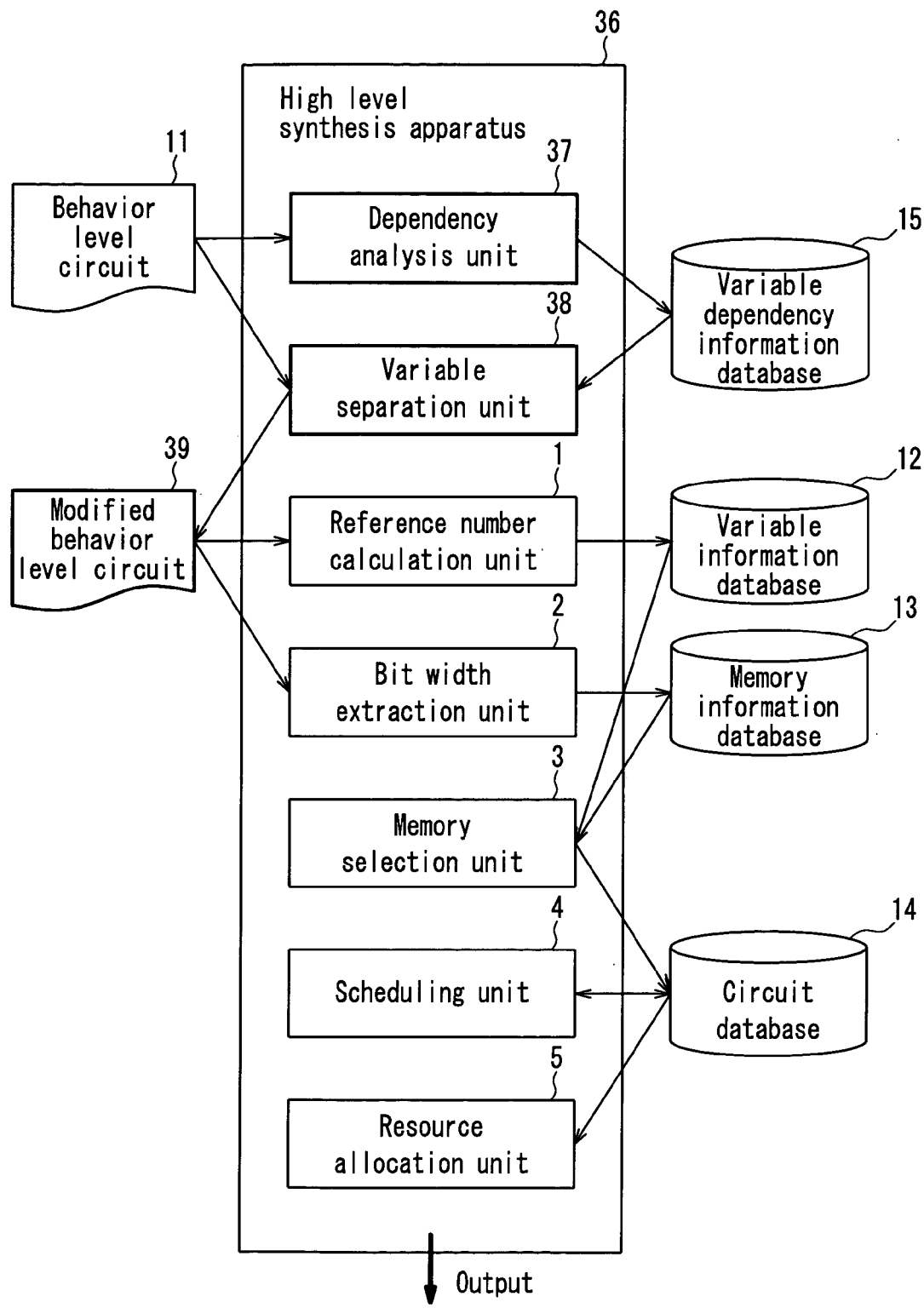
FIG. 17 is a block diagram schematically showing still another exemplary structure of the high level synthesis apparatus according to Embodiment 3 of the present invention.

The following describes still another exemplary high level synthesis apparatus and high level synthesis method according to Embodiment 3. FIG. 17 is a block diagram schematically showing the structure of this high level synthesis apparatus according to Embodiment 3 of the present invention. FIG. 18 shows an exemplary behavior level circuit used in Embodiment 3, wherein FIG. 18A shows the state before the variable separation and FIG. 18B shows the state after the variable separation.

As shown in FIG. 17, the high level synthesis apparatus 36 includes a dependency analysis unit 37 and a variable separation unit 38, which is a difference from the high level synthesis apparatus 20 of Embodiment 2 shown in FIG. 5. The remaining structure of the high level synthesis apparatus 36 is similar to that of the high level synthesis apparatus 20 shown in FIG. 5.

The dependency analysis unit 37 performs dependency analysis concerning array variables or structure variables described in the behavior level circuit 11 and judges the presence or absence of the dependence between arbitrary variables out of these variables. If the dependence is present, the dependency analysis unit 37 calculates a distance vector between the variables having the dependence. Furthermore, the dependency analysis unit 37 outputs information for specifying the presence or absence of the dependence and the calculated distance vector to a variable dependency information database 15.

The variable separation unit 38 fetches information from the variable dependency information database 15 and confirms the presence or absence of the dependence. If the dependency is present, the variable separation unit 38 specifies variables constituting a new variable to be generated based on the calculated distance vector and performs the variable separation. The variable separation unit 38 is different in this respect from the variable separation unit 21 shown in FIG. 5. If there is no dependence between the variables, the variable separation unit 38 may perform the variable separation in the same manner as in the variable separation unit 21 shown in FIG. 5 by specifying the variables described in the same section.

More specifically, in the case of the behavior level circuit 11 shown in FIG. 18A, the dependency analysis unit 37 judges that the dependence is present between array elements a[i] and a[i+1]. In this case, the variable separation unit 38 performs the variable separation with respect to the array variable a. Herein, since the distance vector is 1, the variable separation unit 38 separates alternate elements into different variables from each other as shown in FIG. 18B. Thereby, new array variables a1 and a2 are generated.

Note here that the dependency analysis of the array elements can be performed by determining a Diophantine equation from an index variable of the array elements and by solving this equation as explained by Nakata, "Structure and Optimization of Compiler", published by Asakura shoten (1999).

Figure 19:
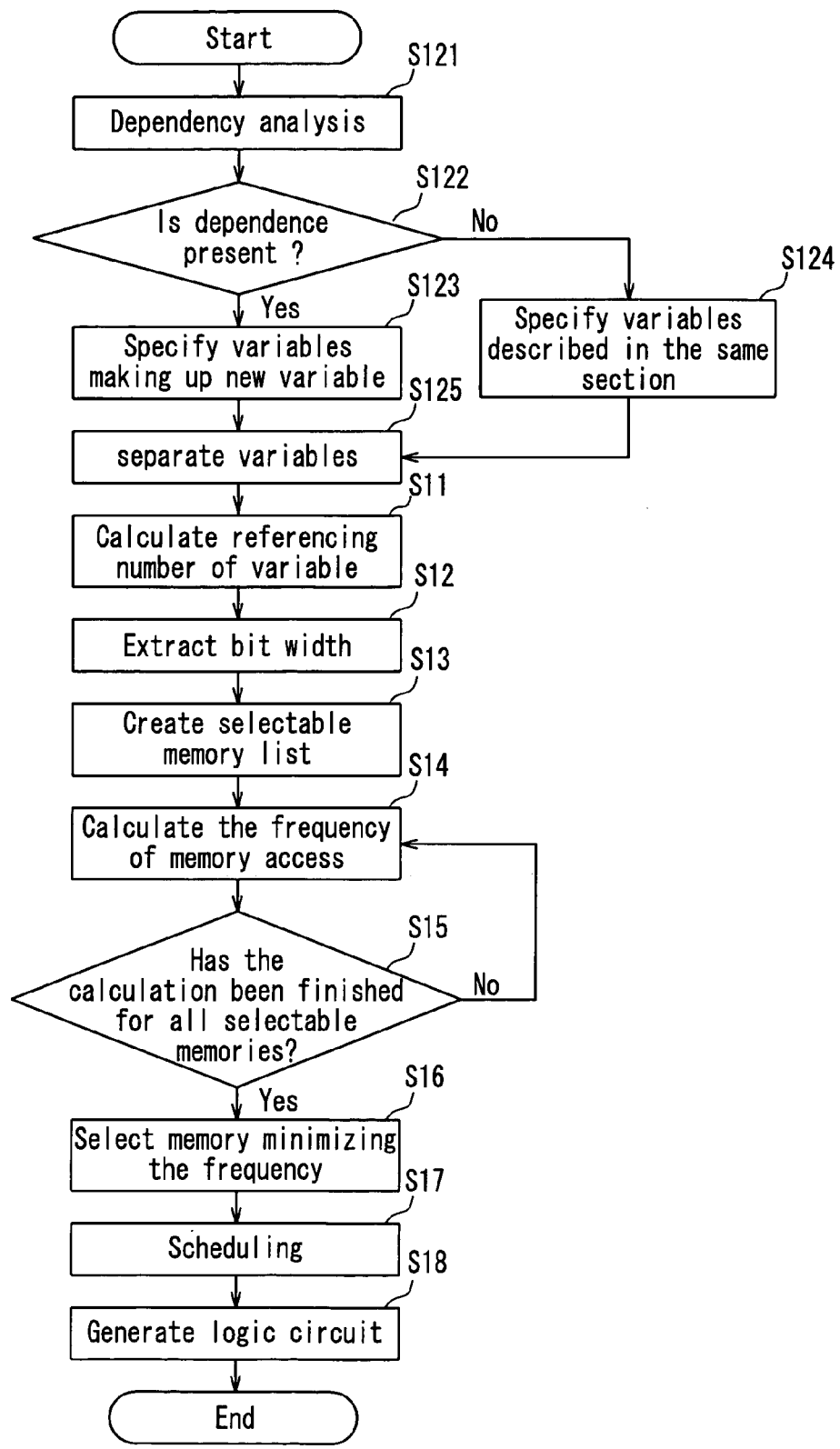
FIG. 19 is a flowchart showing the operation of the high level synthesis apparatus shown in FIG. 17.

The following describes the operation of the high level synthesis apparatus 36 shown in FIG. 17. The high level synthesis method of Embodiment 3 can be implemented by operating the high level synthesis apparatus 36 also. FIG. 19 is a flowchart showing the operation of the high level synthesis apparatus shown in FIG. 17. The following description refers to FIG. 17 as needed.

As shown in FIG. 19, firstly, the dependency analysis unit 37 performs dependency analysis with respect to array variables or structure variables described in the behavior level circuit 11 (Step S121), and outputs the result of the dependency analysis to the variable dependency information database 15.

Following this, the variable separation unit 38 confirms the presence or absence of the dependence (Step S122). If no dependence is present, the variable separation unit 38 specifies the variables described in the same section similarly to Step S101 shown in FIG. 6 (Step S124), and thereafter the variable separation unit 38 performs variable separation similarly to Step S102 shown in FIG. 6 (Step S125).

On the other hand, if the dependence is present, the variable separation unit 38 specifies variables constituting new variables (array variables) based on the calculated distance vector (Step S123) and performs the variable separation (S125). Herein, at Step S125, a modified behavior level circuit 39 on which the variable separation unit 38 performs variable separation is created.

Thereafter, based on the modified behavior level circuit 39, the number of referencing is calculated (Step S11) and the bit width is extracted (Step S12). Furthermore, similarly to the example of FIG. 6, Step S13 to Step S18 are executed.

FIG. 20 shows the bit widths and the number of referencing of variables and shows the bit widths and the sum of the frequency of selectable memories in the case where the variable separation is performed and in the case where the variable separation is not performed. FIG. 20A shows the case where the variable separation is not performed, and FIG. 20B shows the case where the variable separation is performed.

As shown in FIG. 20B, in the case where the variable separation unit 38 (See FIG. 17) performs the variable separation with respect to the behavior level circuit 11 (See FIG. 18A), a 8-bit memory can be allocated for each of the array variables a1 and a2 described in the modified behavior level circuit 39 (See FIG. 18B). In this case, the sum of the frequency of memory access becomes 10 cycles.

On the other hand, as shown in FIG. 20A, in the case where the variable separation is not performed with respect to the behavior level circuit 11 (See FIG. 11A), only one 8-bit memory can be allocated for the array a, and therefore the sum of the frequency of memory access becomes 20 cycles.

In this way, similarly to Embodiment 2, this embodiment also allows further reduction of the frequency compared with Embodiment 1.

Additionally, according to Embodiment 3, an array variable can be separated or integrated with array elements, and therefore the variation for allocating the memories can be increased. As a result, a method for allocating the memories that can realize a reduced frequency can be obtained.

(Embodiment 4)

Figure 21:
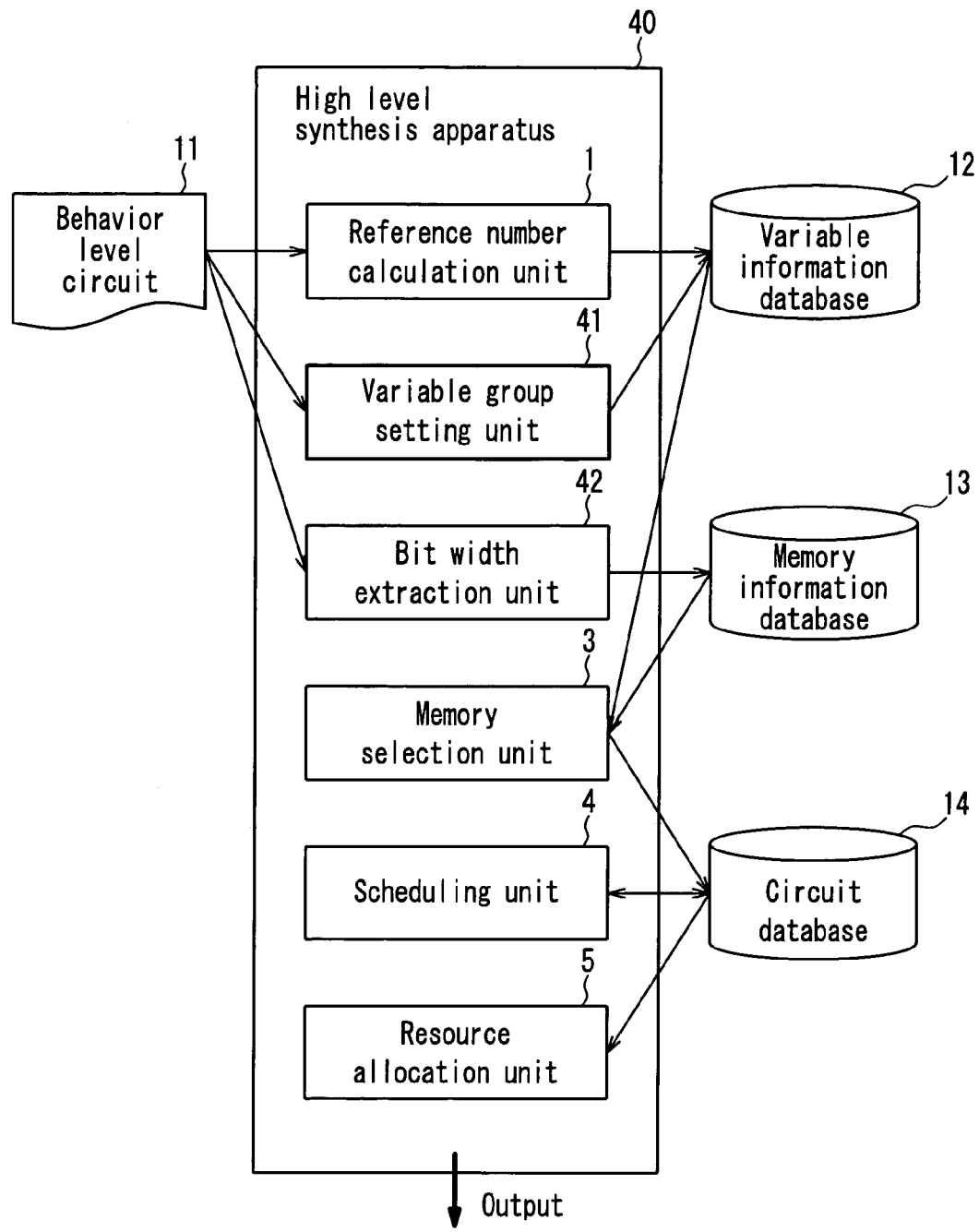
FIG. 21 is a block diagram schematically showing the structure of a high level synthesis apparatus according to Embodiment 4 of the present invention.
Figure 22:
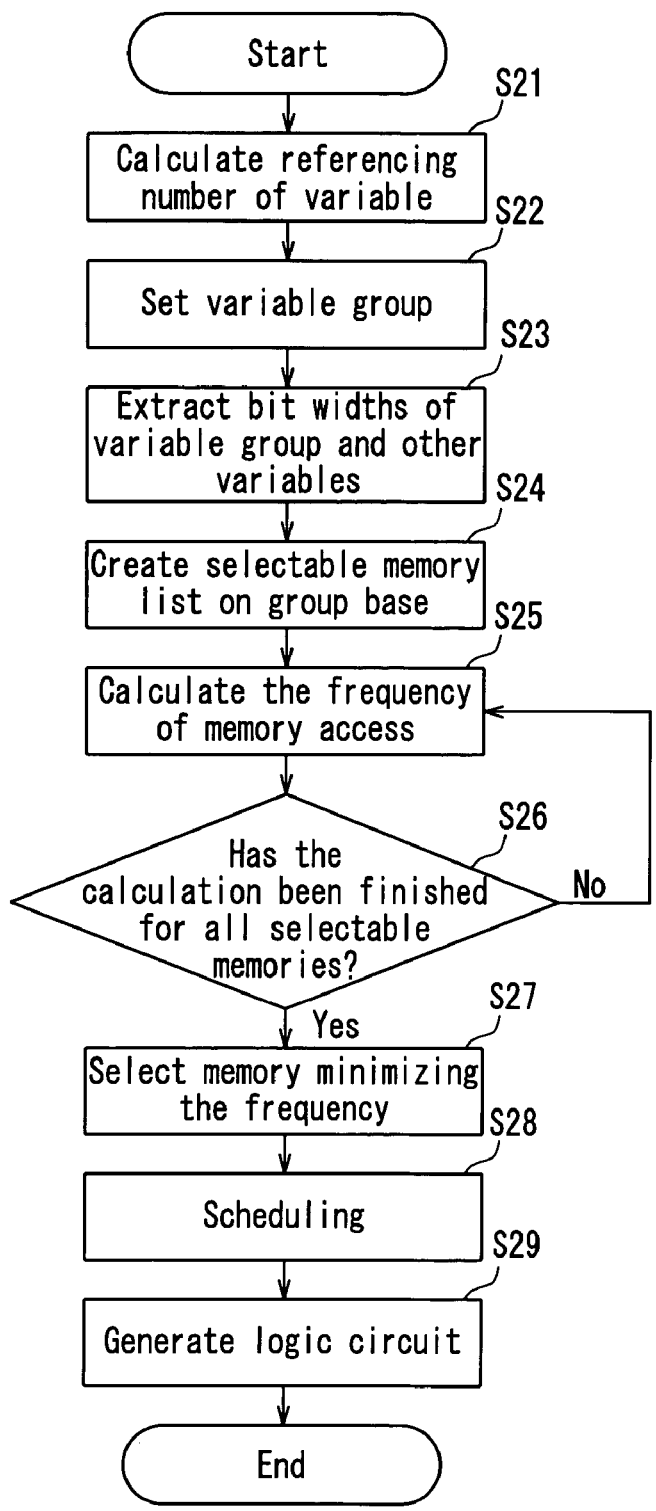
FIG. 22 is a flowchart showing a high level synthesis method according to Embodiment 4 of the present invention.

Referring now to FIGS. 21 to 23, a high level synthesis apparatus and a high level synthesis method according to Embodiment 4 of the present invention will be described below. Firstly, the structure of the high level synthesis apparatus according to Embodiment 4 will be described, with reference to FIG. 21. FIG. 21 is a block diagram schematically showing the structure of the high level synthesis apparatus according to Embodiment 4 of the present invention.

As shown in FIG. 21, the high level synthesis apparatus 40 according to Embodiment 4 includes a variable group setting unit 41, which is a difference from the high level synthesis apparatus 10 of Embodiment 1 shown in FIG. 1. Furthermore, a bit width extraction unit 42 provided in the high level synthesis apparatus 40 is different from the bit width extraction unit 2 provided in the high level synthesis apparatus 10 shown in FIG. 1 in terms of the function. As for the remaining respects, the high level synthesis apparatus 40 is configured similarly to the high level synthesis apparatus 10 shown in FIG. 1.

The variable group setting unit 41 sets one or a plurality of variable group made up of variables described in the behavior level circuit 11. For this purpose, the bit width extraction unit 42 extracts the bit width of a variable group and the bit widths of variables that do not constitute the variable group. Furthermore, the bit width extraction unit 42 selects a plurality of memories (selectable memories) as a target of the allocation for the variable group and the variables that do not constitute the variable group.

The following describes the setting of the variable groups performed by the variable group setting unit 41. In Embodiment 4, there are two types of methods for setting variable groups performed by the variable group setting unit 41, which includes: a concentration grouping method; and a distribution grouping method.

According to the concentration grouping method, a variable group is constituted with variables that are described in the same section in the behavior level circuit 11. According to the distribution grouping method, a variable group is constituted with variables that are not described in the same section in the behavior level circuit 11. According to the distribution grouping method, a plurality of variables described in the same section each constitute a different variable group.

For instance, in the case where a plurality of groups are set by the concentration grouping method and a different memory is allocated for each variable group, the access to the memories is concentrated to one memory for a constant time period, thus allowing other non-operating memories to suspend during the time period.

On the other hand, when a plurality of groups are set by the distribution grouping method, the access may be conducted concurrently for different memories, thus reducing the frequency of memory access.

In this way, different effects are obtained according to the grouping methods of the variables, and the variable group setting unit 41 may designate a grouping method in accordance with the effects required for LSIs as a final product.

Furthermore, the concentration grouping method includes, as a method for setting variable groups, a method in which the number of variables constituting each variable group becomes uniform among the variable groups, and a method in which the number becomes non-uniform.

In the case of the former setting method adopted, since the memory usage rate for the respective variable groups can be made uniform, memories in the same size can be used. Thereby, an advantage of facilitating the layout in LSI can be attained.

On the other hand, in the case of the latter setting method adopted, since the number of the variables can be differentiated among the variable groups, a variable group having a short referencing period can be set. Therefore, the number of memories that should be accessed during a constant time period can be reduced, so that it becomes possible to increase the time period for suspending the memories.

Moreover, in Embodiment 4, an upper limit can be set for the number of variable groups that the variable group setting unit 41 is allowed to set. When an upper limit is set for the number of variable groups, the situation where the number of memories to be allocated increases, which increases an area of an overhead in LSI, can be avoided.

Referring now to FIGS. 22 to 23, the high level synthesis method according to Embodiment 4 will be described below. The high level synthesis method of Embodiment 4 can be implemented by operating the high level synthesis apparatus 40 according to Embodiment 4 that is shown in FIG. 21. Therefore, the following describes the high level synthesis method based on the operations of the high level synthesis apparatus, while referring to FIG. 21 as needed.

FIG. 22 is a flowchart showing the high level synthesis method according to Embodiment 4 of the present invention. FIG. 23 shows a behavior level circuit used in Embodiment 4, the bit widths of the variables and the frequency of memory access, wherein FIG. 23A shows an exemplary behavior level circuit, FIG. 23B shows the number of referencing and the bit widths of the variables described in the behavior level circuit shown in FIG. 23A and FIG. 23C shows the sum of the frequency of memory access for each selectable memory.

As shown in FIG. 22, first of all, the reference number calculation unit 1 reads the behavior level circuit 11 so as to calculate the number of referencing for each variable described in the behavior level circuit 11 (Step S21). Note here that Step S21 is performed similarly to Step S1 shown in FIG. 2.

More specifically, in the case of the behavior level circuit 11 shown in FIG. 23A, the number of referencing is calculated concerning array variables a and b and member variables a.m1, a.m2, a.m3, a.m4b.n1 and b.n2.

Next, the variable group setting unit 41 makes a judgment as to whether the respective variables specified in Step S21 are described in the same section or not, and based on the result of the judgment, sets variable groups (Step S22). In Embodiment 4 also, similarly to Embodiment 2, the judgment as to whether the variables are described in the same section may be based on whether the variables are described in one for sentence.

In the example of FIG. 22, the variable group setting unit 41 adopts the distribution grouping method, in which the variables that are not described in the same section constitute a variable group. In the behavior level circuit shown in FIG. 23A, array variables a and b are not described in the same for sentence. That is, these variables are not described in the same section. For that reason, in the example of FIG. 22, the variable group setting unit 41 sets a group g1 made up of the array variables a and b as shown in FIG. 23B.

Next, the bit width extraction unit 42 extracts the bit widths concerning the variable group and the variables that do not constitute the variable group (Step S23), and furthermore creates a selectable memory list in which memories as selectable memories are selected (Step S24). Moreover, the bit width extraction unit 42 outputs the selectable memory list to a memory information database 13.

More specifically, the bit width extraction unit 42, as shown in FIG. 23B, extracts the bit widths of the variable group g1 and the member variables a.m1, a.m2, a.m3, a.m4b.n1 and b.n2 that do not constitute the variable group.

In the example of FIG. 23, the bit width of the variable group is carried out by specifying the variable having the maximum bit width among the variables included in the variable group and by extracting the bit width of this specified variable. For instance, in the example of FIG. 23A, since the array variables a and b both are 32 bits, the bit width of the variable group g1 becomes 32 bits. Furthermore, even when n1 and n2 are in the chr type and the bit width of the array variable b is 16 bits, if the array variable a has the bit width of 32 bits, the bit width of the variable group g1 becomes 32 bits.

In the example of FIG. 22, a variable group and member variables that do not constitute the variable group are allocated to one memory. For that reason, as shown in FIG. 23C, 8-bit memory M41, 16-bit memory M42 and 32-bit memory M43 are selected as selectable memories.

Note here that although only one variable group is set in the behavior level circuit 11 shown in FIG. 23A, if a plurality of variable groups are present in Embodiment 4, the bit width is extracted for each variable group. Furthermore, when a plurality of variable groups are present, the bit width extraction unit 42 creates the selectable memory list with consideration given also to the case where the plurality of variable groups are allocated to one memory.

Following this, based on the numbers of referencing calculated in Step S21 and the bit widths extracted in Step S23, the memory selection unit 3 calculates the sum of the frequency of memory access for each selectable memory as shown in FIG. 23C (Step S25). Herein, Step S25 is performed similarly to Step S4 shown in FIG. 2.

After that, similarly to Step S5 shown in FIG. 2, the memory selection unit 3 makes a judgment as to whether the sum of the frequency of memory access has been calculated for all of the selectable memories (Step S26).

If the calculation of the sum of the frequency has not been finished for all of the selectable memories, the memory selection unit 3 executes Step S25 again. On the other hand, if the calculation of the sum of the frequency has been finished for all of the selectable memories, then the memory selection unit 3 executes Step S27.

In Step S27, similarly to Step S6 shown in FIG. 2, the memory selection unit 3 compares the sums of the frequency of memory access concerning the respective selectable memories. In Embodiment 4, the memory selection unit 3 selects 32-bit memory M43 as a target for allocation that minimizes the sum of the frequency of memory access.

Thereafter, similarly to Steps S7 and S8 shown in FIG. 2, the scheduling by the scheduling unit 4 (Step S28), the allocation of resources by the resource allocation unit 5 and the like are performed, whereby a logic circuit is generated (Step S29). The generated logic circuit is output to the outside.

As stated above, similarly to Embodiment 1, Embodiment 4 also enables the selection of a memory having the optimum bit width depending on the operation described in a behavior level circuit, thus optimizing the frequency of memory access.

Furthermore, unlike Embodiment 1, since a plurality of variables as a target of the allocation to a memory are allocated to one memory in Embodiment 4, an area of overhead that would be generated when a plurality of memories are to be used can be saved. For that reason, an area of the memory used in LSI can be reduced.

Although the same section in Embodiment 4 is designated as the section described in a for sentence, the same section is not limited to this. For example, similarly to Embodiment 2, a fundamental block in the behavior level circuit 11 can be defined as the same section.

Furthermore, the scheduling unit 4 may perform tentative scheduling that is different from the scheduling in Step S28. In this case, a plurality of variables that can be judged to be accessed in the same cycle from the result of this tentative scheduling can be defined as those described in the same section.

The following describes one embodiment in which the scheduling unit 4 performs the tentative scheduling. Even in the embodiment for tentative scheduling, the high level synthesis apparatus has the similar structure to that of FIG. 21. However, this apparatus is different from the high level synthesis apparatus 40 shown in FIG. 21 in terms of the operations of the variable group setting unit 41 (See FIG. 21) and the scheduling unit 4 (See FIG. 5). Thus, the steps for executing the high level synthesis method also are different from those shown in FIG. 22.

Figure 24:
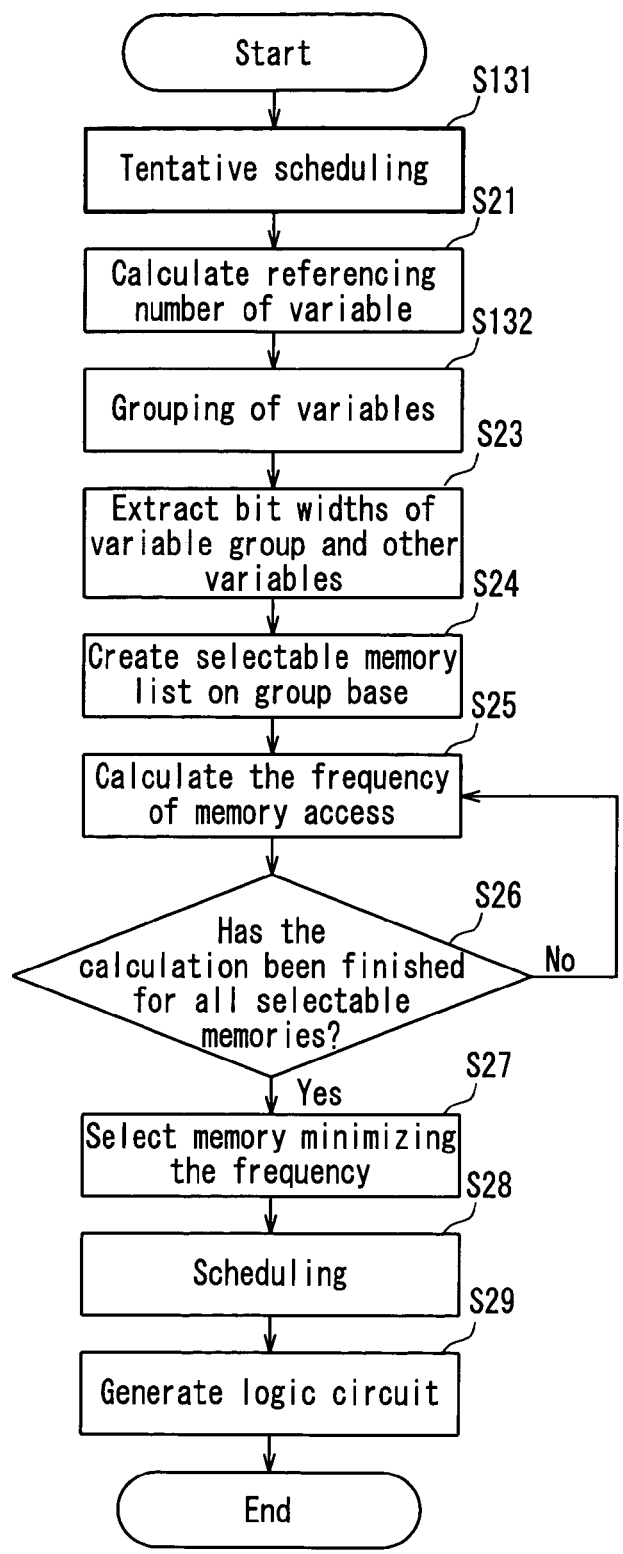
FIG. 24 is a flowchart of the high level synthesis method of Embodiment 4 in which tentative scheduling is performed.

Referring now to FIG. 24, the high level synthesis method of Embodiment 4, in which the tentative scheduling is performed, will be described below. FIG. 24 is a flowchart showing the high level synthesis method of Embodiment 4 in which the tentative scheduling is performed. The following description may refer to FIG. 21 as needed.

As shown in FIG. 24, first of all, the scheduling unit 4 performs the tentative scheduling similarly to Step S111 shown in FIG. 9 (Step S131). More specifically, the scheduling unit 4 allocates all variables described in the behavior level circuit 11 each to a different memory so as to perform the scheduling of execution cycles of the behavior level circuit 11.

Next, the reference number calculation unit 1 executes Step S21 (See FIG. 22). Furthermore, the variable group setting unit 41 specifies variables described in the same section based on the result of the scheduling in Step S131, and sets a variable group (Step S132).

More specifically, the variable group setting unit 41 specifies the variables that are accessed within a range of a predetermined frequency of an execution cycle, thus making a judgment as to whether the variables are described in the same section or not. The judgment as to whether they are in the same section or not is performed similarly to Step S112 shown in FIG. 9.

After that, similarly to the example of FIG. 22, Steps S23 to S29 are executed. In such an embodiment also, a variable group can be set to include the variables that are not described in the same section and a plurality of variables as a target of the allocation to a memory can be allocated to one memory.

(Embodiment 5)

Figure 25:
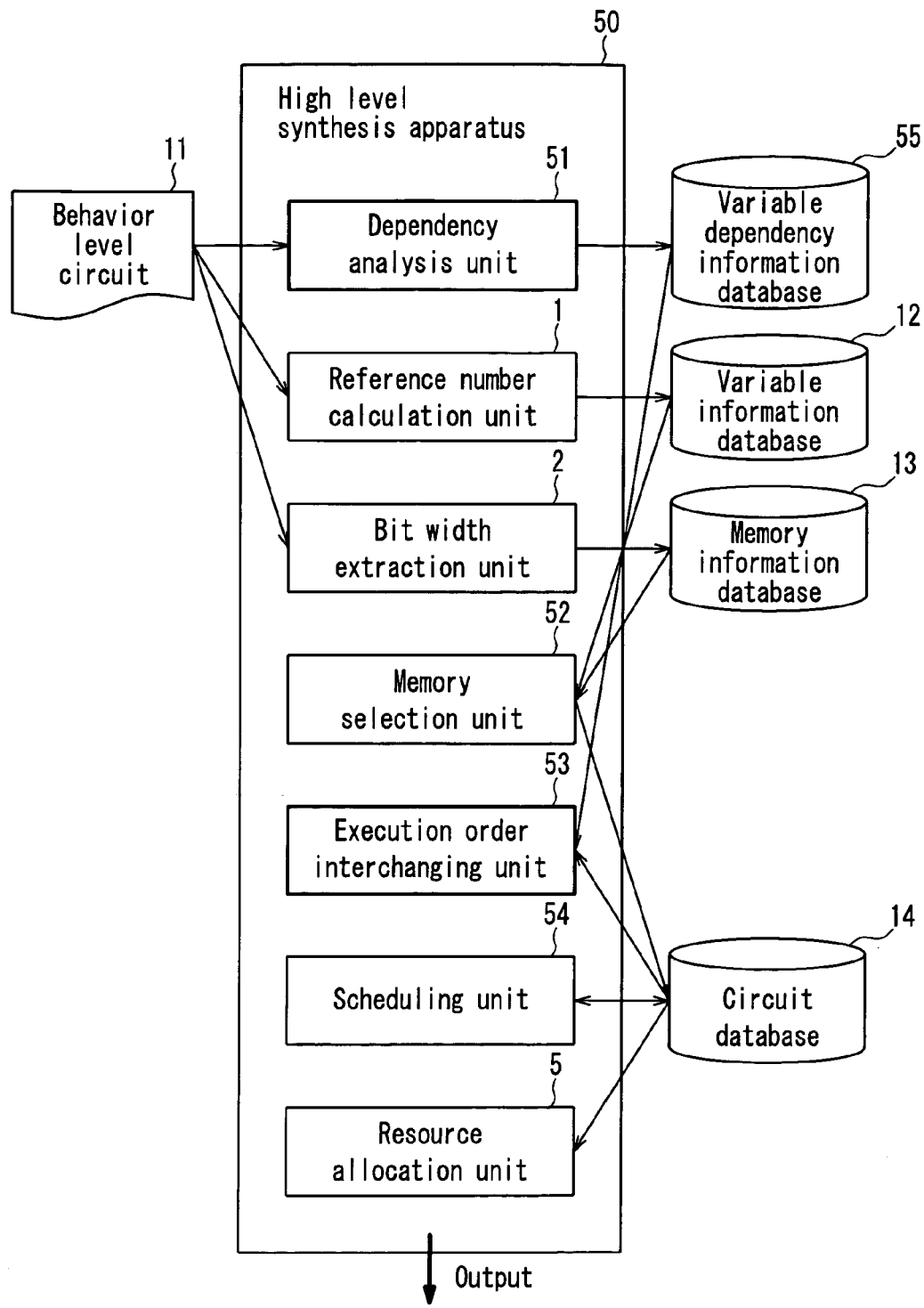
FIG. 25 is a block diagram schematically showing the structure of a high level synthesis apparatus according to Embodiment 5 of the present invention.

Referring now to FIGS. 25 to 30, a high level synthesis apparatus and a high level synthesis method according to Embodiment 5 of the present invention will be described below. Firstly, the structure of the high level synthesis apparatus according to Embodiment 5 will be described, with reference to FIG. 25. FIG. 25 is a block diagram schematically showing the structure of the high level synthesis apparatus according to Embodiment 5 of the present invention.

As shown in FIG. 25, the high level synthesis apparatus 50 according to Embodiment 5 includes a dependency analysis unit 51 and an execution order interchanging unit 53, which is a difference from the high level synthesis apparatus 10 of Embodiment 1 shown in FIG. 1. Furthermore, a memory selection unit 52 and a scheduling unit 54 provided in the high level synthesis apparatus 50 are different from the memory selection unit 3 and the scheduling unit 4 provided in the high level synthesis apparatus 10 shown in FIG. 1 in terms of the function. As for the remaining respects, the high level synthesis apparatus 50 is configured similarly to the high level synthesis apparatus 10 shown in FIG. 1.

The dependency analysis unit 51 has functions different from those of the dependency analysis unit 37 of Embodiment 3 shown in FIG. 17. The dependency analysis unit 51 extracts a repetition processing described in the behavior level circuit 11, analyzes the dependence among variables included in the extracted repetition processing and outputs the result of the analysis to a variable dependency information database 55. The execution order interchanging unit 53 interchanges the execution order in the repetition processing based on the result of the analysis of the dependence by the dependency analysis unit 51 so that variables referred to at the same time can be executed in the same execution cycle.

The scheduling unit 54, which is unlike the scheduling unit 4 of Embodiment 1 shown in FIG. 1, performs scheduling before a memory to which a variable is to be allocated is determined. In Embodiment 5, the scheduling unit 54 allocates a variable to the memory selected as a selectable memory before the memory selection unit 52 calculates the frequency of memory access, so as to perform the scheduling of execution cycles in the behavior level circuit 11. Thereby, the relationship between the cycle in which the memory is accessed and the cycle in which operations are executed can be obtained.

Furthermore, the memory selection unit 52 has the following functions in addition to the functions similar to those of the memory selection unit 3 of Embodiment 1 shown in FIG. 1: that is, the memory selection unit 52 makes a judgment based on the result of the scheduling by the scheduling unit 54 as to whether an operation processing that can be executed in parallel with the memory access is present or not. If such an operation processing is present, the memory selection unit 52 corrects the calculated sum of the frequency of memory access.

In Embodiment 5, the memory selection unit 52 makes a judgment from the result of the scheduling as to whether the memory access is a preceding reading cycle (processing) in which writing follows reading and as to whether this preceding reading cycle can be executed in parallel with the other operation processing. Furthermore, if, as a result of the judgment, the preceding reading cycle is present and this preceding reading cycle can be executed in parallel with the other operation processing, the memory selection unit 52 corrects the total frequency so that the frequency of the preceding reading cycle of memory access is not included in the total frequency.

Referring now to FIGS. 26 to 30, the high level synthesis method according to Embodiment 5 will be described below.

The high level synthesis method of Embodiment 5 can be implemented by operating the high level synthesis apparatus 50 according to Embodiment 5 that is shown in FIG. 25. Therefore, the following describes the high level synthesis method based on the operations of the high level synthesis apparatus, while referring to FIG. 25 as needed.

Figure 26:
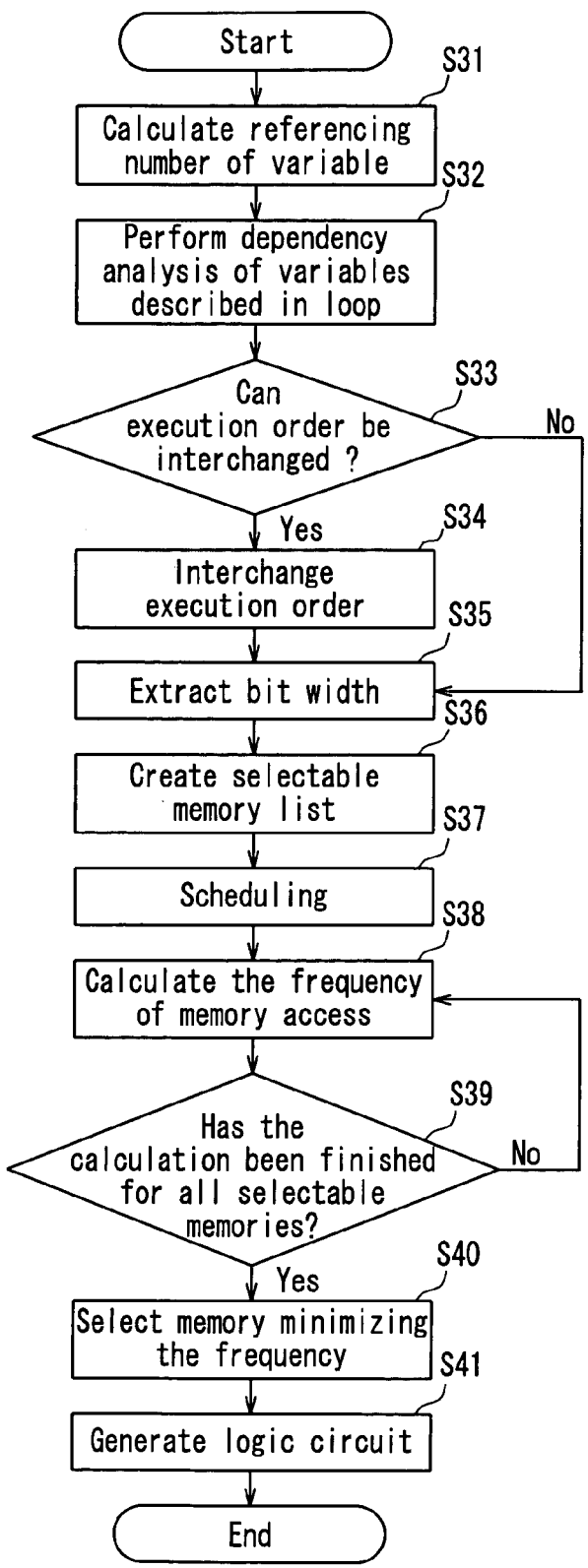
FIG. 26 is a flowchart showing a high level synthesis method according to Embodiment 5 of the present invention.

FIG. 26 is a flowchart showing the high level synthesis method according to Embodiment 5 of the present invention. FIG. 27 shows a behavior level circuit used in Embodiment 5, bit widths of variables and the frequency of memory access, wherein FIG. 27A shows an exemplary behavior level circuit, FIG. 27B shows the number of referencing and the bit widths of the variables described in the behavior level circuit shown in FIG. 27A and FIG. 27C shows the sum of the frequency of memory access for each selectable memory.

As shown in FIG. 26, first of all, the reference number calculation unit 1 reads the behavior level circuit 11 so as to calculate the number of referencing for each variable described in the behavior level circuit 11 (Step S31). Note here that Step S31 is performed similarly to Step S1 shown in FIG. 2.

More specifically, in the case of the behavior level circuit shown in FIG. 27A, the reference number calculation unit 1 calculates the number of referencing concerning array variables a to c and member variables a.m1, a.m2, b.m1, b.m2, c.m1 and c.m2, as shown in FIG. 27B. Note here that FIG. 27B shows the number of referencing of the array variable a and the member variables a.m1 and a.m2 only.

Next, the dependency analysis unit 51 analyzes the dependence among the variables included in a for loop described in the behavior level circuit 11 (Step S32). More specifically, the dependency analysis is performed with respect to the variables included in the first to fourth for sentences described in FIG. 27A. Furthermore, the dependency analysis unit 51 outputs the result of the analysis to the variable dependency information database 55.

Following this, the execution order interchanging unit 53 reads the result of the analysis by the dependency analysis unit 51 from the variable dependency information database 55, and makes a judgment based on the result as to whether the execution order can be interchanged or not, that is, as to whether a plurality of variables that are referred to at the same time are included in the for sentences or not (Step S33).

As a result of the judgment, if the execution order cannot be interchanged, the bit width extraction unit 2 extracts the bit widths of the respective variables similarly to Step S2 of Embodiment 1 shown in FIG. 2 (See FIG. 27B) (Step S35).

On the other hand, if the execution order can be interchanged, the execution order interchanging unit 53 interchanges the execution order (Step S34), thereafter the bit width extraction unit 2 executes Step S35.

In Embodiment 5, the execution order interchanging unit 53 makes a judgment that the execution order can be interchanged concerning the third for sentence in the behavior level circuit 11 shown in FIG. 27A, and interchanges the execution order concerning the third for sentence. The following describes this with reference to FIG. 28.

FIG. 28 shows the execution order of the third for sentence in the behavior level circuit shown in FIG. 27A, wherein FIG. 28A shows the state prior to the interchanging of the execution order and FIG. 28B shows the state after the interchanging of the execution order. In FIG. 28, the third for sentence is represented by source codes.

In Embodiment 5, the execution order interchanging unit 53 extracts a reading processing required prior to a writing processing (preceding reading processing) from the behavior level circuit shown in FIG. 28A, and interchanges the order of the preceding reading processing as shown in FIG. 28B.

As can be seen from FIG. 28A, prior to the interchanging, the number of accessing by the array variable in one for loop is three times, and the sum of the required frequency becomes 27 cycles. On the contrary, as can be seen from FIG. 28B, after the interchanging, the number of accessing by the array variable in one for loop is two times, and therefore one time of accessing can be reduced. In addition, the sum of the required frequency becomes 19 cycles (18 cycles in the loop and 1 cycle outside the loop), and therefore 8 cycles in total can be reduced.

When Step S35 is executed, the bit width extraction unit 2 selects memories to which array variables a, b and c are to be allocated. In Embodiment 5, 8-bit memory and 16-bit memory are selected as selectable memories for the respective array variables. Note here that FIG. 27C shows selectable memories M51 (8-bit) and M52 (16-bit) for the array variable a only.

Following this, the scheduling unit 54 performs the scheduling of execution cycles in the behavior level circuit 11 (Step S37). Herein, the scheduling is performed while allocating the variables to the memories selected as the selectable memories and is performed for each selectable memory.

Figure 29:
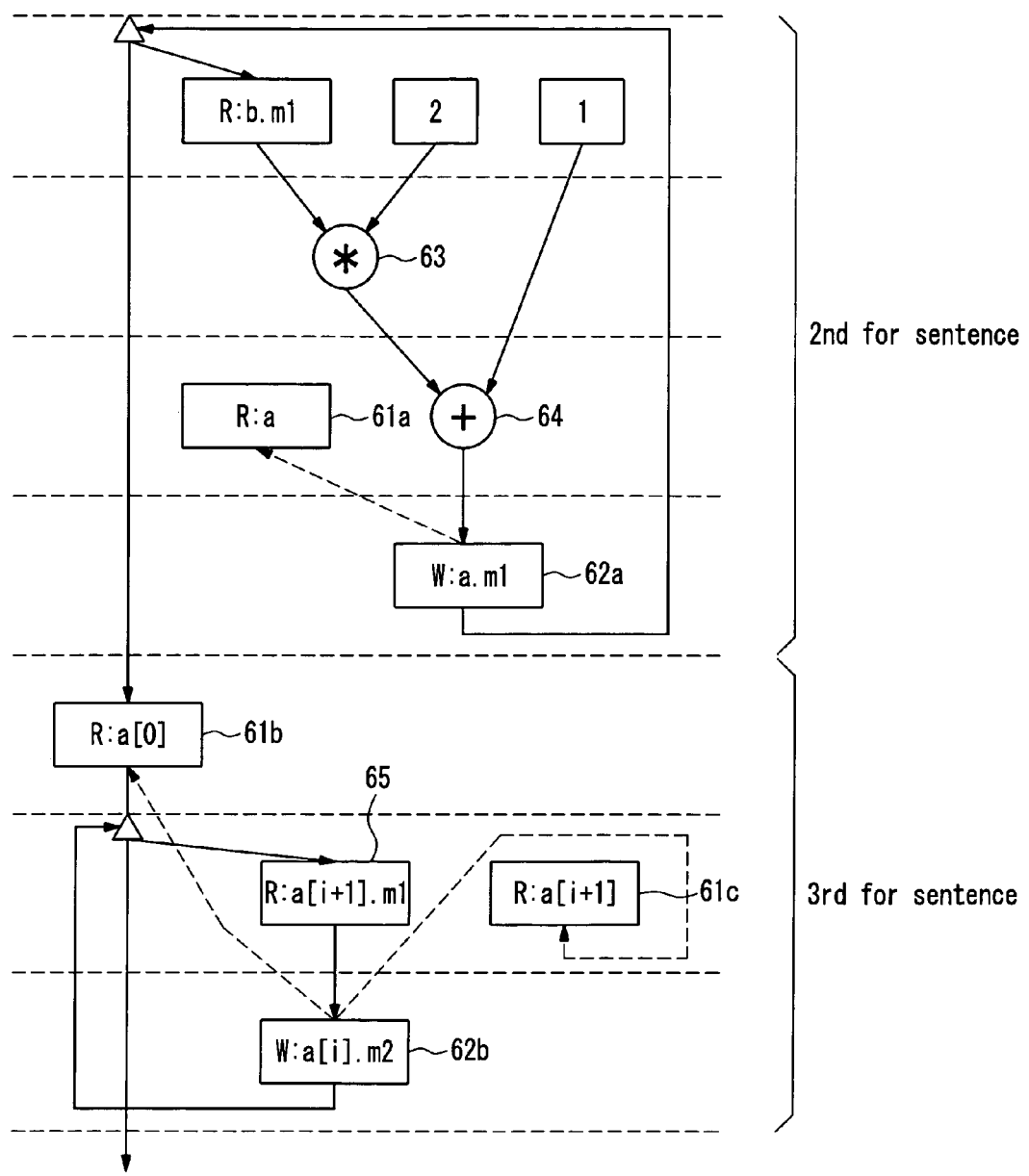
FIG. 29 shows the result of the scheduling of the behavior level circuit shown in FIG. 27A.

FIG. 29 shows the result of the scheduling of the behavior level circuit shown in FIG. 27A. FIG. 29 shows the result of the scheduling when the selectable memory is 16 bits. Furthermore, FIG. 29 shows the second for sentence and the third for sentence in the behavior level circuit shown in FIG. 27A.

In FIG. 29, the arrows indicated by solid lines show the flow of data and control, and the arrows indicated by dashed lines show reading (R) processing prior to the writing (W) processing (preceding reading processing) that is required when the bit width of the memory is larger than the bit width of the variable.

Furthermore, in FIG. 29, reference numerals 62a and 62b denote the writing (W) processing when the bit width of the memory is larger than the bit width of the variable, and 61a to 61c denote the preceding reading processing when the bit width of the memory is larger than the bit width of the variable. Triangle marks denote the repetition judgment for the for loop. Reference numeral 63 denotes the operation processing of "*", 64 denotes the operation processing of "+", and 65 denotes a reading processing.

Next, the memory selection unit 52 calculates the frequency of memory access for each selectable memory (Step S38). In Embodiment 5, unlike the other embodiments, a memory access cycle table shown in FIG. 30 is used for the calculation of the frequency. FIG. 30 shows the memory access cycle table used in Embodiment 5.

Furthermore, in Embodiment 5, the memory selection unit 52 makes a judgment as to whether the memory access is a preceding reading processing or not and, if the memory access is a preceding reading processing, makes a judgment as to whether this processing can be executed in parallel with the other operation processing. Then, based on the results of the judgment, the memory selection unit 52 corrects the calculation result of the calculated frequency. Moreover, also in the case where the execution order is interchanged in Step S34, the memory selection unit 52 corrects the calculation result of the frequency. The following describes this with reference to FIG. 27B.

"The frequency 1 (third column)" in FIG. 27C shows the frequency that is calculated without consideration of the scheduling in Step S37 and the interchanging of the execution order in Step S34. That is, the frequency is shown, which is calculated similarly to Step S4 of Embodiment 1 shown in FIG. 2, by referring to the number of referencing shown in FIG. 27B and the memory access cycle table shown in FIG. 30.

More specifically, in the case where the selectable memory is M51, m1(R)+m1(W)+m2(W)+a(R)=9+10+9+(10×2)=48. In the case where the selectable memory is M52, m1(R)+m1(W)+m2(W)+a(R)=9+(10×2)+(9×2)+10×2=57.

"The frequency 2 (fourth column)" in FIG. 27C shows the frequency when the memory selection unit 52 judges from the scheduling results that the preceding reading cycle is present and this can be executed in parallel with the other operation processing.

As shown in FIG. 29, in the case where the selectable memory is M52 of 16 bits, the operation processing "+" 64 and the preceding reading processing 61a shown in FIG. 29 are present in the same cycle, and therefore they can be executed in parallel with each other. Therefore, the calculation is performed so that the frequency of the preceding reading processing 61a for the variable a.m1 is not included in the total frequency.

More specifically, in the case where the selectable memory is M52, m1(R)+m1(W)+m2(W)+a(R)=9+10+(9×2)+10=47. In the case where the selectable memory is M51, the preceding reading processing is not performed, and therefore the frequency becomes equal to "The frequency 1 (third column)".

"The frequency 3 (fifth column)" in FIG. 27C shows the frequency with consideration given to the case of the frequency 2 and the interchanging of the execution order in Step S34 also.

As can be seen from the third for sentence shown in FIG. 29, as a result of the interchanging of the execution order in Step S34, the reading processing 65 and the preceding reading processing 61c are performed in parallel with each other in the same execution cycle. Therefore, the calculation is performed so that the frequency of the preceding reading processing 61c is not included in the total frequency. Herein, since the preceding reading processing 61b is performed outside the loop, the frequency (1 cycle) for the preceding reading processing 61b should be added.

More specifically, in the case where the selectable memory is M52, m1(R)+m1(W)+m2(W)+a(R)=9+10+(9+1)+10=39. In the case where the selectable memory is M51, the preceding reading processing is not performed, and therefore the frequency becomes equal to "The frequency 1 (third column)".

Thereafter, similarly to Step S5 shown in FIG. 2, the memory selection unit 52 makes a judgment as to whether the sum of the frequency of memory access has been calculated for all of the selectable memories (Step S39).

If the calculation of the sum of the frequency of memory access has not been finished for all of the selectable memories, the memory selection unit 52 executes Step S38 again. On the other hand, if the calculation of the sum of the frequency has been finished for all of the selectable memories, then the memory selection unit 52 executes Step S40.

In Step S40, similarly to Step S6 shown in FIG. 2, the memory selection unit 52 compares the sums of the frequency of memory access for the respective selectable memories. In Embodiment 5, the memory selection unit 52 selects, as a target of the allocation, memory M52 of 16 bits that minimizes the sum of the frequency of memory access.

Finally, similarly to Step S8 shown in FIG. 2, the allocation of resources by the resource allocation unit 5 and the like are performed, whereby a logic circuit is generated (Step S41). The generated logic circuit is output to the outside.

As stated above, in Embodiment 5 also, similarly to Embodiment 1, the memory having an optimum bit width can be selected depending on the operations described in the behavior level circuit. Therefore, the frequency of memory access can be optimized.

Furthermore, according to Embodiment 5, the dependency analysis and the scheduling allow the analysis of the presence or absence of the operation processing that can be executed in parallel with the memory access, and consequently consideration can be given to the case where a part of the cycle of the memory access would be hidden. Therefore, as compared with Embodiment 1, a memory having a further optimum bit width can be allocated.

(Embodiment 6)

Figure 31:
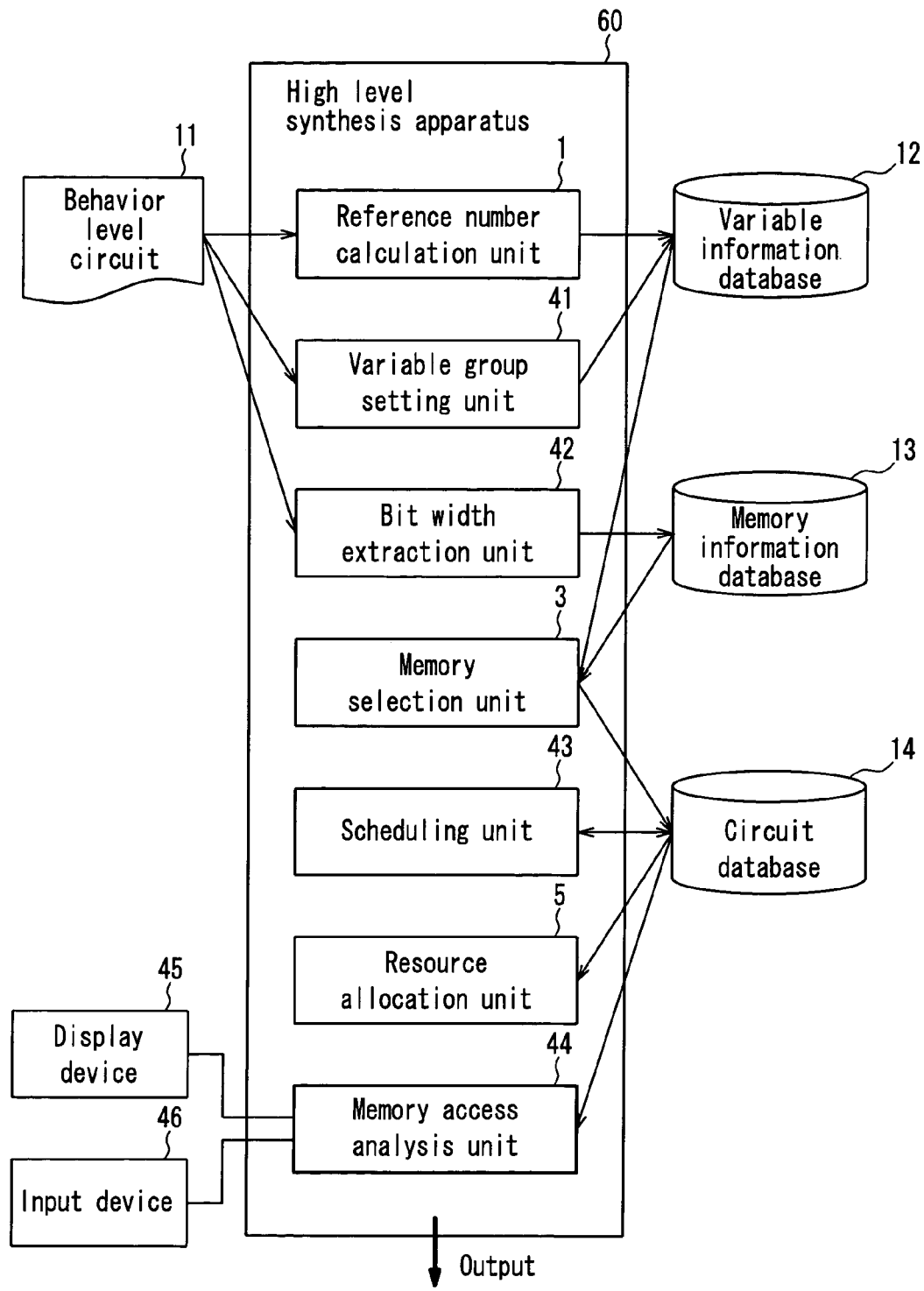
FIG. 31 is a block diagram schematically showing the structure of a high level synthesis apparatus according to Embodiment 6 of the present invention.
Figure 32:
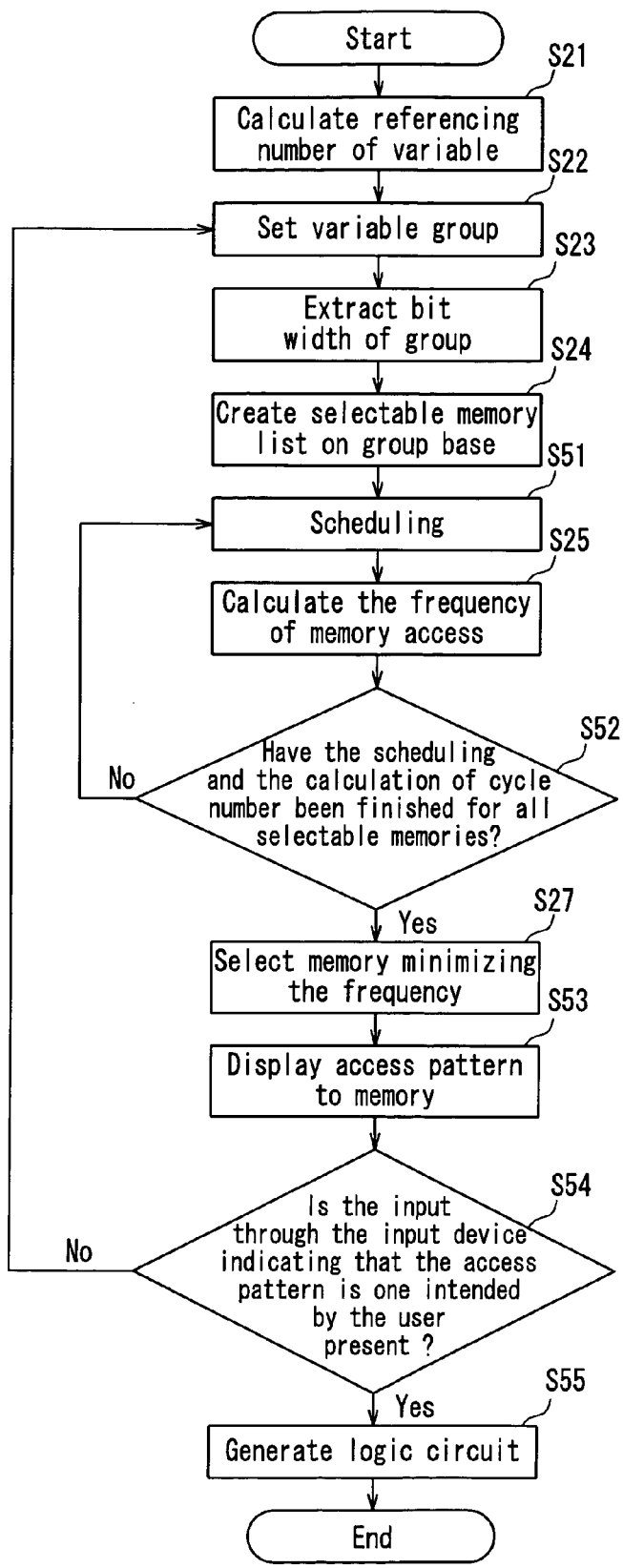
FIG. 32 is a flowchart showing a high level synthesis method according to Embodiment 6 of the present invention.

Referring now to FIGS. 31 to 33, a high level synthesis apparatus and a high level synthesis method according to Embodiment 6 of the present invention will be described below. Firstly, the structure of the high level synthesis apparatus according to Embodiment 6 will be described, with reference to FIG. 31. FIG. 31 is a block diagram schematically showing the structure of the high level synthesis apparatus according to Embodiment 6 of the present invention.

As shown in FIG. 31, the high level synthesis apparatus 60 according to Embodiment 6 includes a memory access analysis unit 44, which is a difference from the high level synthesis apparatus 40 of Embodiment 4 shown in FIG. 21. Furthermore, a scheduling unit 43 of the high level synthesis apparatus 60 is different from the scheduling unit 4 of the high level synthesis apparatus 40 shown in FIG. 21 in terms of the function. As for the remaining respects, the high level synthesis apparatus 60 is configured similarly to the high level synthesis apparatus 40 of Embodiment 4 shown in FIG. 21.

Unlike the scheduling unit 4 (See FIG. 21), the scheduling unit 43 performs the scheduling after a bit width extraction unit 42 creates a selectable memory list and before a memory selection unit 3 selects memories, the scheduling being performed so that variables are allocated to selected memories (selectable memories) and the scheduling of execution cycles in the behavior level circuit 11 is performed. The scheduling by the scheduling unit 43 is performed for each of the selectable memories.

As a result of such scheduling, the scheduling unit 43 obtains information representing a relationship between the cycle in which accessing is performed to the memories and the cycle in which operations are executed, and the scheduling unit 43 outputs this information to the memory access analysis unit 44.

Furthermore, after the memory selection unit 3 selects memories as a target for allocation among the selectable memories, the memory access analysis unit 44 lets a display device 45 display an access pattern to the memories, the access pattern being obtained from the scheduling by the scheduling unit 43.

In Embodiment 6, the memory access analysis unit 44 extracts the access pattern in the case where continuous accesses of the predetermined frequency or more to the same memory are present and in the case where a plurality of memories that are not accessed in the same cycle are present, and lets the display device 45 display the access pattern.

Furthermore, an input device 46 is connected to the memory access analysis unit 44, whereby an instruction from a user using the high level synthesis apparatus 60 can be input through the input device 46.

Referring now to FIGS. 32 to 33, the high level synthesis method according to Embodiment 6 will be described below. The high level synthesis method of Embodiment 6 can be implemented by operating the high level synthesis apparatus 60 according to Embodiment 6 that is shown in FIG. 31. Therefore, the following describes the high level synthesis method based on the operations of the high level synthesis apparatus, while referring to FIG. 31 as needed. FIG. 32 is a flowchart showing the high level synthesis method according to Embodiment 6 of the present invention.

As shown in FIG. 32, similarly to the example of Embodiment 4 shown in FIG. 22, first of all, the following procedures are executed sequentially: the number of referencing of the respective variables described in the behavior level circuit 11 is calculated (Step S21); variable groups are set (Step S22); the bit widths are extracted (Step S23) and a selectable memory list is created (Step S24).

Next, in Embodiment 6, unlike the example of Embodiment 4 shown in FIG. 22, the scheduling unit 43 performs the scheduling (Step S51). More specifically, the scheduling unit 43 allocates variables to the selectable memories specified in the selectable memory list and performs the scheduling of execution cycles in the behavior level circuit 11.

Next, similarly to the example of Embodiment 4 shown in FIG. 22, the memory selection unit 3 calculates the frequency of memory access (Step S25). Furthermore, the memory selection unit 3 makes a judgment as to whether the scheduling and the calculation of the sum of the frequency have been finished for all of the selectable memories or not (Step S52).

If the scheduling and the calculation of the sum of the frequency have not been finished for all of the selectable memories, Step S51 and Step S25 are executed again. On the other hand, if the scheduling and the calculation of the sum of the frequency have been finished for all of the selectable memories, the memory selection unit 3 selects as a target for allocation a memory that minimizes the sum of the frequency similarly to the example of Embodiment 4 shown in FIG. 22 (Step S27).

Next, the memory access analysis unit 44 outputs the display data of an access pattern to the display device 45, and the display device 45 displays the access pattern showing the scheduling result in Step S51 (Step S53). Herein, the access pattern output in Step S53 is the access pattern in the case where the memories selected in Step S27 are allocated for the variables.

More specifically, the memory access analysis unit 44 firstly extracts continuous accesses of the predetermined frequency or more to the same memory and a plurality of memories that are not accessed in the same cycle from the scheduling result in Step S51.

Figure 33A:
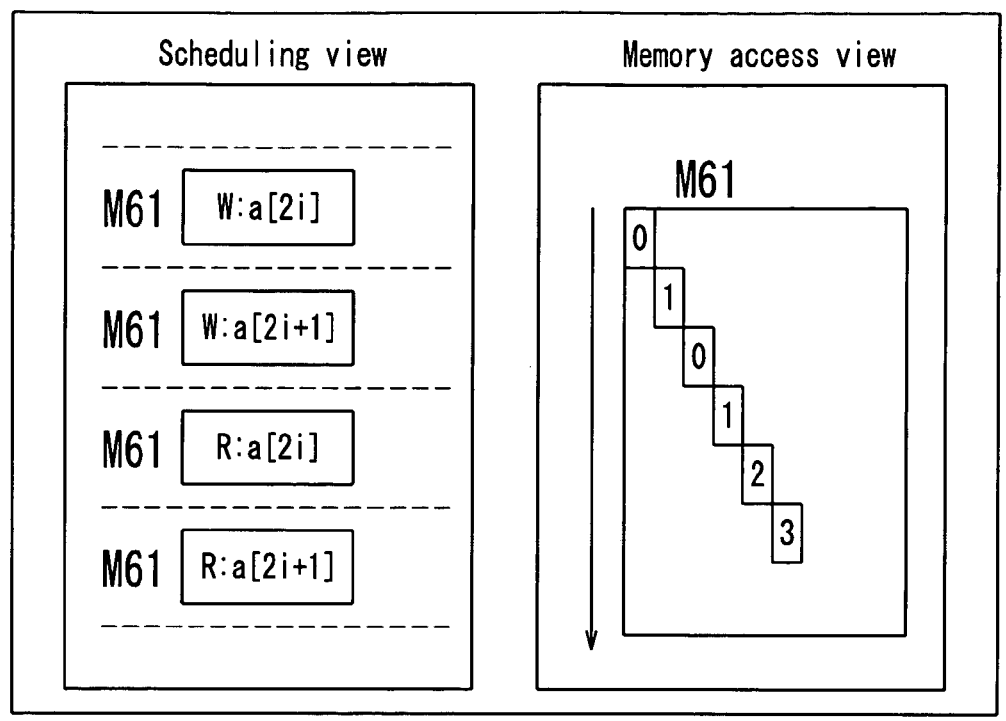
FIG. 33A shows the access pattern showing continuous accesses of the predetermined frequency or more to the same memory and FIG. 33B shows the access pattern showing the access state for a plurality of memories that are not accessed in the same cycle.

As a result, if the former can be extracted, the memory access analysis unit 44 lets the display device 45 display the access pattern showing these continuous accesses (See FIG. 33A). If the latter can be extracted, the memory access analysis unit 44 lets the display device 45 display the access pattern showing the access state for these plurality of memories (See FIG. 33B). The following describes the access patterns with reference to FIG. 33.

Figure 33B:
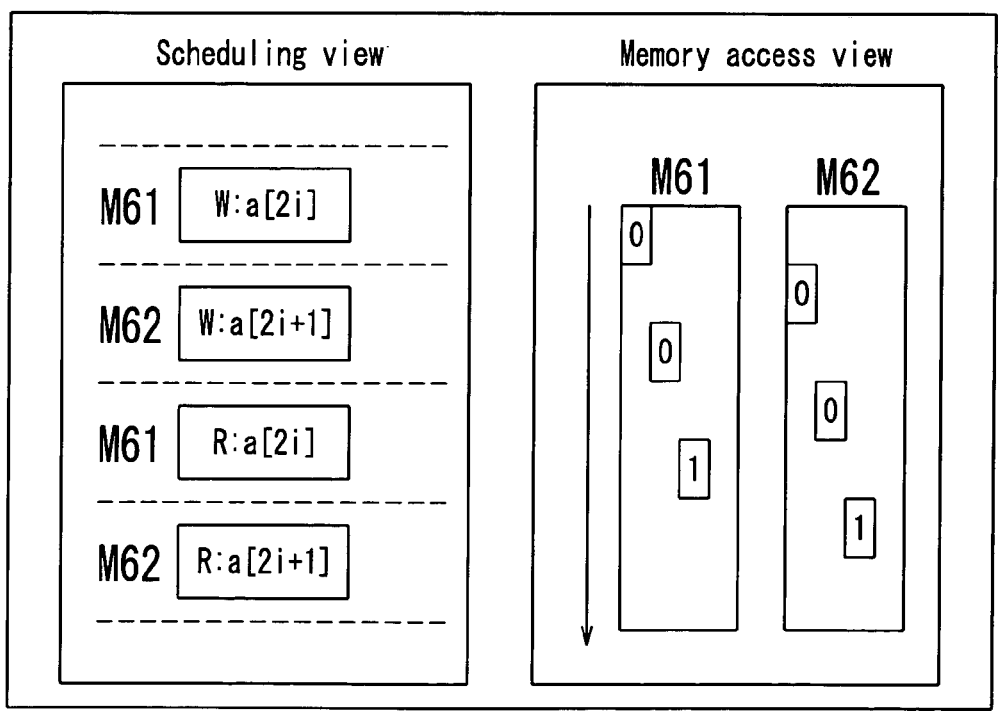

FIG. 33 shows exemplary access patterns, wherein FIG. 33A shows the access pattern showing continuous accesses of the predetermined frequency or more to the same memory and FIG. 33B shows the access pattern showing the access state for a plurality of memories that are not accessed in the same cycle.

As shown in FIGS. 33A and 33B, the access patterns have the "scheduling view" showing the scheduling result and the "memory access view" illustrating a memory mapping of variables in the scheduling view. In the memory access view, the vertical axis denotes the number of execution cycles, and figures in this drawing show memory addresses that are accessed. M61 and M62 in FIG. 33 denote memories to which variable a is allocated.

In the scheduling views shown in FIGS. 33A and 33B, each execution cycle is divided by dashed lines, which shows that W: a[2i] and W: a[2i+1] are scheduled in separate execution cycles, for instance. Furthermore, the access patterns shown in FIGS. 33A and 33B are the access patterns of the behavior level circuit in which a repetition loop for increasing the variable i by one is described.

When such an access pattern shown in FIG. 33A is displayed on the display device 45, the user can understand that the continuous accesses of a certain frequency or more is performed to memory M61. On the other hand, when the access pattern shown in FIG. 33B is displayed in the display device 45, the user can understand that memory M61 and memory M62 are not accessed in the same cycle. Therefore, the user can judge as to whether the access pattern obtained from the present allocation to the memories complies with his/her intention or not.

After that, the memory access analysis unit 44 makes a judgment as to whether the input through the input device 46, indicating that the access pattern is one intended by the user, is present or not (Step S54). If the input from the user indicates that the access pattern is not one intended by the user, the procedure starts from the setting of variable groups in Step S22 again. On the other hand, if the input from the user indicates that the access pattern is one intended by the user, a logic circuit is generated (Step S55) so as to finish the procedure.

As stated above, according to Embodiment 6, a user can confirm that the allocation of variables to memories complies with his/her intention from the displayed access patterns to the memories. Therefore, in the case of the access pattern that does not comply with his/her intention, the procedure can return to the setting of variable groups, so that more effective grouping (group setting) can be performed.

Note here that the example explained in FIGS. 31 to 33 describes the case where variable groups are set. However, Embodiment 6 is not limited to such an example, and for example, this embodiment is applicable to the case where the variables are separated or integrated as in Embodiments 1 to 3.

(Embodiment 7)

Figure 34:
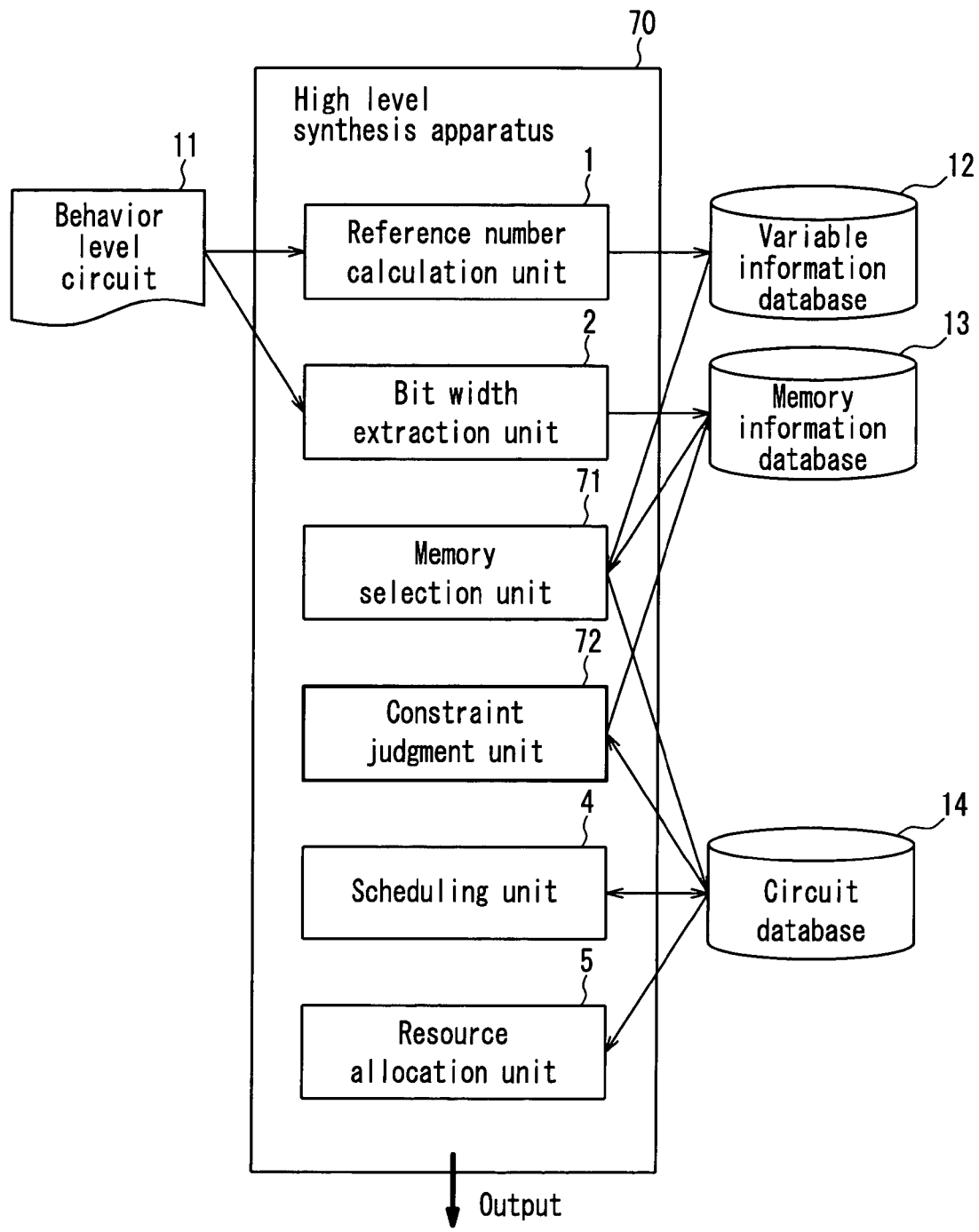
FIG. 34 is a block diagram schematically showing the structure of a high level synthesis apparatus according to Embodiment 7 of the present invention.

Referring now to FIGS. 34 to 37, a high level synthesis apparatus and a high level synthesis method according to Embodiment 7 of the present invention will be described below. Firstly, the structure of the high level synthesis apparatus according to Embodiment 7 will be described, with reference to FIG. 34. FIG. 34 is a block diagram schematically showing the structure of the high level synthesis apparatus according to Embodiment 7 of the present invention.

As shown in FIG. 34, the high level synthesis apparatus 70 according to Embodiment 7 includes a constraint judgment unit 72, which is a difference from the high level synthesis apparatus 10 of Embodiment 1 shown in FIG. 1. Furthermore, a memory selection unit 71 provided in the high level synthesis apparatus 70 is different from the memory selection unit 3 provided in the high level synthesis apparatus 10 of Embodiment 1 shown in FIG. 1 in terms of the function. As for the remaining respects, the high level synthesis apparatus 70 is configured similarly to the high level synthesis apparatus 10 shown in FIG. 1.

When the memory selection unit 71 selects memories to which variables are to be allocated, the constraint judgment unit 72 specifies a plurality of memory cells corresponding to the selected memories. Herein, in Embodiment 7, the constraint judgment unit 72 specifies the memory cells based on a library (not illustrated) for LSI design.

Furthermore, the constraint judgment unit 72 makes a judgment as to whether the access time of the specified memory cells satisfies a predetermined condition or not, i.e., makes a delay error or not. As a result of the judgment, if the memory cells that do not make the delay error are present, the constraint judgment unit 72 selects the memory cell having the shortest access time. On the other hand, if all of the specified memory cells make a delay error, the constraint judgment unit 72 does not select any memory cells.

More specifically, in Embodiment 7, the constraint judgment unit 72 firstly acquires the access time of the specified memory cells from the library for LSI design. Next, from the result of the scheduling by the scheduling unit 4, the constraint judgment unit 72 determines the execution time of the operations other than the memory access in the specified memory cells, and calculates the delay time in one cycle. For instance, if the memory access time is 4 ns and the execution time of the operations other than the memory access is 7 ns, the delay time becomes 11 ns.

Furthermore, the constraint judgment unit 72 compares the calculated delay time with the predetermined delay time in one execution cycle (hereinafter called "delay constraint time"). For instance, it is assumed that the delay constraint time is set at 10 ns. In the case where the calculated delay time is 11 ns as stated above, this case makes the delay error by 1 ns (=11 ns−10 ns). Furthermore, from this, the constraint on the memory access time becomes 3 ns (=4 ns−1 ns).

On the other hand, if the memory access time is shorter than the above case, for example, if the memory access time is 3 ns, the delay time becomes 10 ns (=3 ns+7 ns), which is within the delay constraint time, and therefore this case satisfies the constraint on the delay.

Furthermore, after the memory selection unit 71 selects a memory once, if the constraint judgment unit 72 does not select any memory cells, the memory selection unit 71 excludes the selected selectable memory and selects a memory from selectable memories again.

Next, the high level synthesis method according to Embodiment 7 will be described below, with reference to FIGS. 35 to 36. The high level synthesis method of Embodiment 7 can be implemented by operating the high level synthesis apparatus according to Embodiment 7 that is shown in FIG. 34. Therefore, the following describes the high level synthesis method based on the operations of the high level synthesis apparatus, while referring to FIG. 34 as needed.

Figure 35:
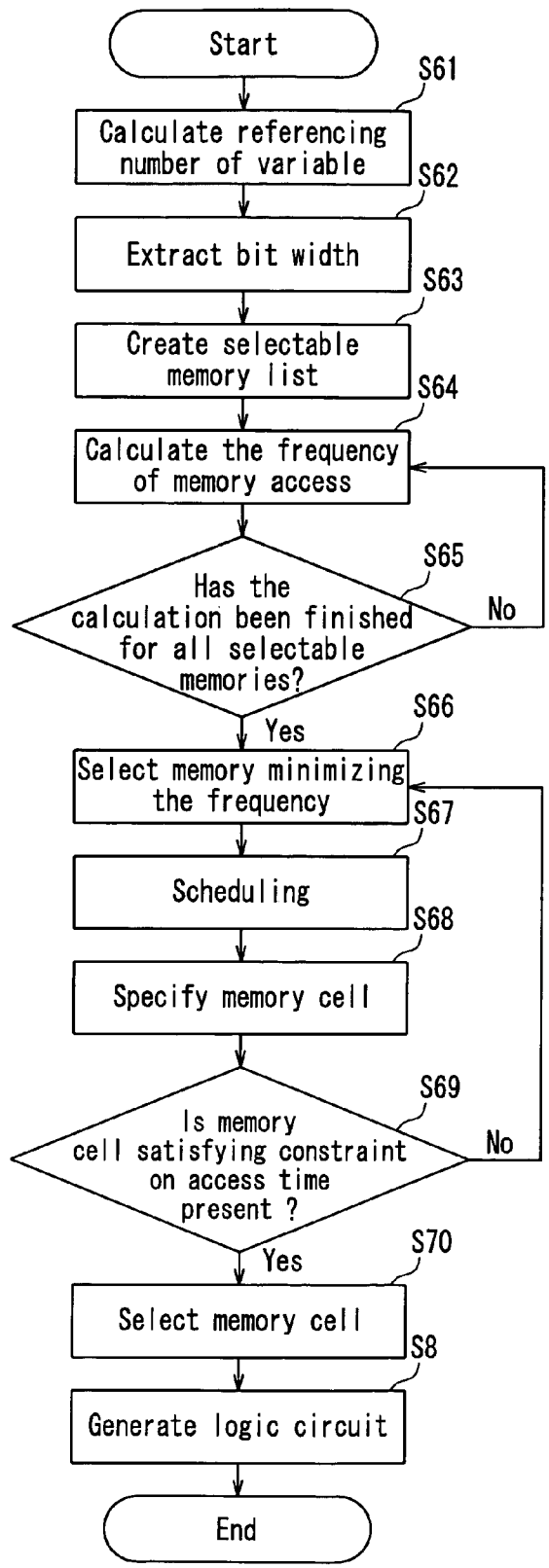
FIG. 35 is a flowchart showing a high level synthesis method according to Embodiment 7 of the present invention.

FIG. 35 is a flowchart showing the high level synthesis method according to Embodiment 7 of the present invention. FIG. 36 shows the behavior level circuit used in Embodiment 7, the bit widths of variables and the frequency of memory access. FIG. 36A shows an exemplary behavior level circuit, FIG. 36B shows the number of referencing and the bit widths concerning the variables described in the behavior level circuit shown in FIG. 36A and FIG. 36C shows the sum of the frequency of memory access for each of the selectable memories.

As shown in FIG. 35, similarly to Step S1 and Step S2 of Embodiment 1 shown in FIG. 2, firstly, the number of referencing of the respective variables described in the behavior level circuit 11 is calculated (Step S61); the bit widths are extracted (Step S62); and a selectable memory list is created (Step S63).

As a result, as shown in FIG. 36B, the number of referencing and the bit widths for each variable are specified. Furthermore, as shown in FIG. 36C, 8-bit memory M71 and 32-bit memory M72 are selected as selectable memories.

Next, similarly to Steps S4 to S6 of Embodiment 1 shown in FIG. 2, the sum of the frequency of memory access for each selectable memory is calculated (Step S64); confirmation is conducted as to whether the calculation for all of the selectable memories has been finished (Step S65); and the memory minimizing the frequency is selected (Step S66).

In Embodiment 7, as can be seen from FIG. 36C, the sum of the frequency is minimized when the 32-bit memory M72 is selected, and therefore the memory M72 is selected.

Following this, similarly to Step S7 of Embodiment 1 shown in FIG. 2, a variable is allocated to the selected memory (memory M72) so as to perform the scheduling (S67).

After that, in the case of Embodiment 1, the logic circuit is generated so as to complete the procedure. However, in Embodiment 7, the constraint judgment unit 72 specifies a memory cell corresponding to the selected memory (memory M72) (Step S68).

Following this, the constraint judgment unit 72 calculates the delay time for each of the specified memory cells, and makes a judgment as to whether memory cells whose calculated delay time is within the delay constraint time are present or not (Step S69).

As a result of the judgment, if the memory cells whose calculated delay time is within the delay constraint time are present, the constraint judgment unit 72 selects the memory cell having the shortest memory access time (Step S70). After that, similarly to the example of FIG. 2 in Embodiment 1, a logic circuit is generated (Step S8) so as to complete the procedure.

On the other hand, as a result of the judgment, if the memory cells whose calculated delay time is within the delay constraint time are not present, Step S66 is executed again. Herein, this step S66 is executed while excluding the firstly selected memory from the selectable memory list.

In the example of FIG. 35, the scheduling is performed once, and then the delay time is determined from the result of the scheduling so as to make a judgment concerning the delay error. However, in Embodiment 7, instead of performing the scheduling, an upper limit may be set for the access time beforehand, and a judgment concerning the delay error can be made based on this upper limit of the access time.

Referring now to FIG. 37, Steps S66 to S70 will be described below more specifically. FIG. 37 shows a list of the physical memory cells in which a 32-bit memory can be mounted. FIG. 37 shows the access time and the area when each memory cell is used.

For instance, the following describes the case where the delay constraint time is set at 10 ns as described above and the execution time of the operations other than the memory access is 7 ns. In this case, the constraint on the memory access time is 3 ns.

First of all, as shown in FIG. 37, memory cells "T1610", "T1620", "T3210" and "T3220" are specified as memory cells corresponding to the memory selected by the memory selection unit 71.

Following this, a judgment is made as to whether each of the memory cells makes the delay error or not. For instance, in the case of the memory cell "T3220" shown in FIG. 37, since the access time is 4 ns, it is judged in Step S68 to be the delay error by 1 ns. Similarly, in the case of the memory cell "T1620", it is judged to be the delay error by 0.5 ns.

On the other hand, since the memory cell "T1610" has the access time of 2.5 ns and the memory cell "T3220" has the access time of 3.0 ns, these memory cells do not make the delay error. Therefore, it is judged that the memory cells satisfying the constraint on the access time are present.

After that, the memory cell "T1610" having a shorter access time is selected. Although a memory cell is selected finally based on the access time in Embodiment 7, a memory cell can be selected based on the area of the memory cell, for example. That is, the memory cell "T3210" having the smallest area can be selected.

As stated above, according to Embodiment 7, even when the access time varies depending on the size of the memories, variables can be allocated to optimum memories because the access time can be regarded as the evaluation indicators for selecting the memory.

(Embodiment 8)

Figure 38:
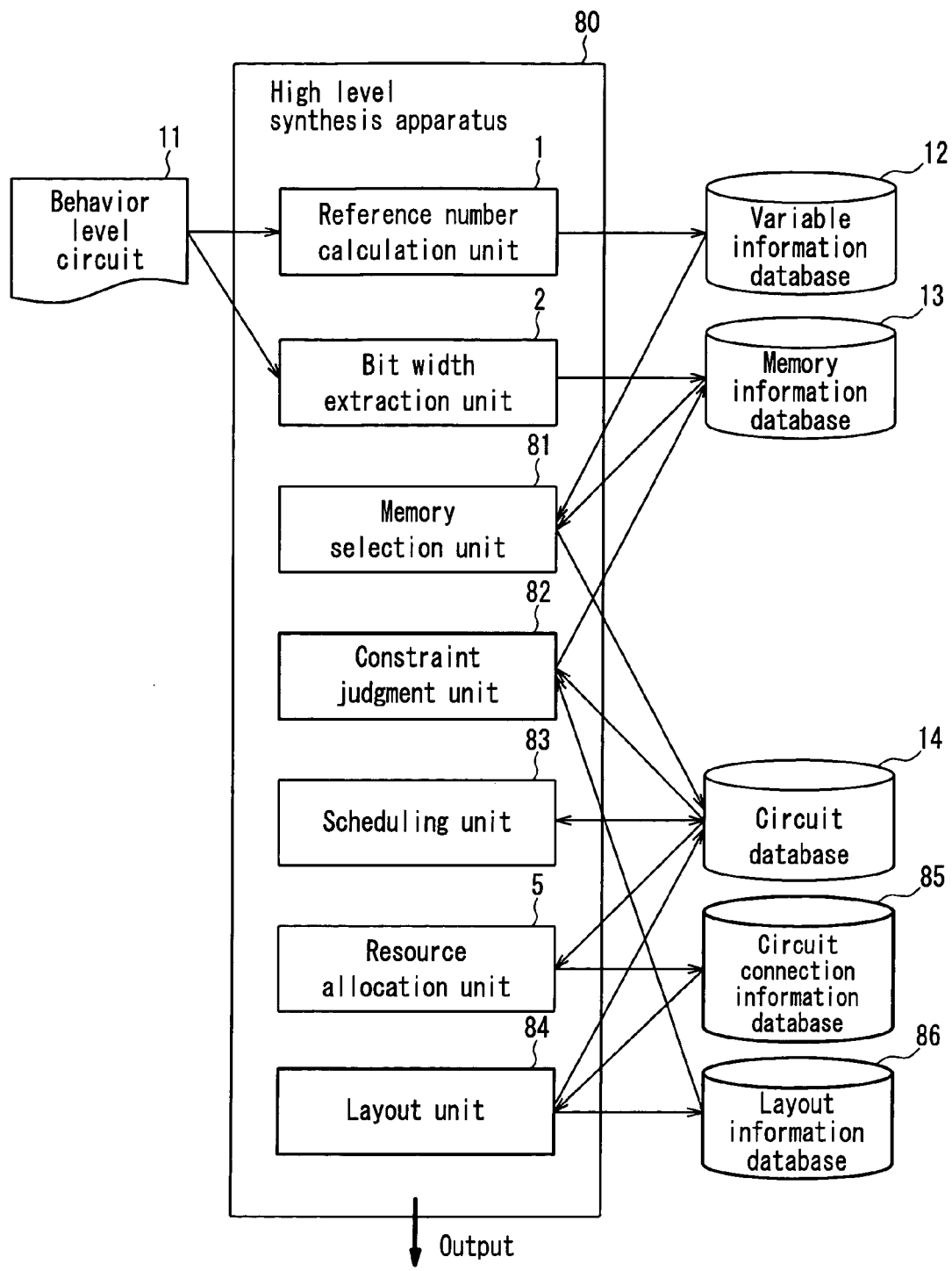
FIG. 38 is a block diagram schematically showing the structure of a high level synthesis apparatus according to Embodiment 8 of the present invention.
Figure 39:
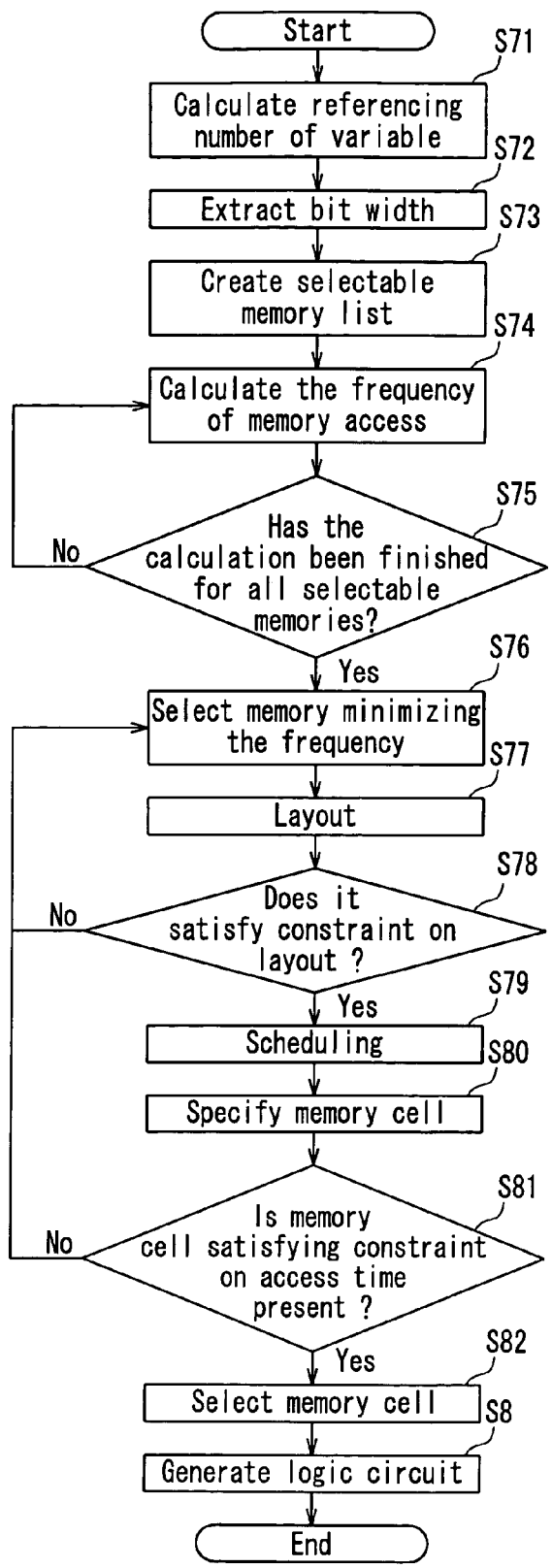
FIG. 39 is a flowchart showing a high level synthesis method according to Embodiment 8 of the present invention.

Referring now to FIGS. 38 to 39, a high level synthesis apparatus and a high level synthesis method according to Embodiment 8 of the present invention will be described below. Firstly, the structure of the high level synthesis apparatus according to Embodiment 8 will be described, with reference to FIG. 38. FIG. 38 is a block diagram schematically showing the structure of the high level synthesis apparatus according to Embodiment 8 of the present invention.

As shown in FIG. 38, the high level synthesis apparatus 80 according to Embodiment 8 includes a layout unit 84, which is a difference from the high level synthesis apparatus 70 of Embodiment 7 shown in FIG. 34. Furthermore, a memory selection unit 81, a constraint judgment unit 82 and a scheduling unit 83 provided in the high level synthesis apparatus 80 are different from the memory selection unit 3, the constraint judgment unit 72 and the scheduling unit 4 provided in the high level synthesis apparatus 70 shown in FIG. 34 in terms of the function. As for the remaining respects, the high level synthesis apparatus 80 is configured similarly to the high level synthesis apparatus 70 shown in FIG. 34.

The layout unit 84 allocates variables to the memories selected by the memory selection unit 81 and performs the layout so as to generate layout information. The layout information specifies the arranged positions of the selected memories and the arranged positions of circuits connected to these memories. The layout information is output to a layout information database 86.

In Embodiment 8, the generation of layout information by the layout unit 84 is performed by layout design based on a logic circuit generated by the resource allocation unit 5. That is, in Embodiment 8, the resource allocation unit 5 generates a logic circuit for layout design by the layout unit 84. The generated logic circuit is output to a circuit connection information database 85, and the layout unit 84 accesses the circuit connection information database 85 as needed.

Furthermore, the layout unit 84 determines the access time, the congestion degree of the routing and the area of a dead space of the selected memories based on the layout information, which are output also to the layout information database 86 together with the layout information.

Similarly to the constraint judgment unit 72 of Embodiment 7 shown in FIG. 34, the constraint judgment unit 82 may specify memory cells corresponding to the selected memories, and moreover may calculate the delay time of each memory cell and make a judgment as to whether this is within the delay constraint time or not.

In addition to these functions, the constraint judgment unit 82 in Embodiment 8 has a function of making a judgment as to whether at least one of the congestion degree of the routing and the area of a dead space satisfies the predetermined conditions (hereinafter called "layout constraint") or not.

Furthermore, the memory selection unit 81 has the following function in addition to the functions similar to those of the memory selection unit 71 of Embodiment 7 shown in FIG. 34: that is, if the constraint judgment unit 82 judges that at least one of the congestion degree of the routing and the area of a dead space does not satisfy the layout constraint, the memory selection 81 selects a memory as selectable memories again, which are different from the firstly selected memory.

Next, the high level synthesis method according to Embodiment 8 will be described below, with reference to FIG. 39. The high level synthesis method of Embodiment 8 can be implemented by operating the high level synthesis apparatus according to Embodiment 8 that is shown in FIG. 38. Therefore, the following describes the high level synthesis method based on the operations of the high level synthesis apparatus, while referring to FIG. 38 as needed. FIG. 39 is a flowchart showing the high level synthesis method according to Embodiment 8 of the present invention.

As shown in FIG. 38, similarly to Steps S61 to S66 of Embodiment 7 shown in FIG. 35, the following steps are executed firstly: the number of referencing is calculated (Step S71); the bit widths are extracted (Step S72); a selectable memory list is created (Step S73); the sum of the frequency of memory access is calculated (Step S74); confirmation is conducted as to whether the calculation has been finished for all of the selectable memories or not (Step S75) and the memory minimizing the frequency is selected (Step S76).

In Embodiment 8, in the case where the behavior level circuit 11 as a target is as shown in FIG. 36A, memory M72 shown in FIG. 36C is selected similarly to Embodiment 7.

Next, unlike Embodiment 7, the layout unit 84 in Embodiment 8 allocates variables described in the behavior level circuit 11 to the selected memories so as to perform the layout (Step S77). Thereby, layout information is generated (Step S77). From Step S77, the access time, the congestion degree of the routing and the area of a dead space of the selected memories can be obtained.

Although not illustrated in FIG. 39, the scheduling unit 83 and the resource allocation unit 5 perform the scheduling and the allocation of resources (synthesis of a logic circuit) in fact for performing the layout. Based on the logic circuit obtained by these steps, the layout is performed.

Following this, the constraint judgment unit 82 makes a judgment as to whether the congestion degree of the routing and the area of a dead space obtained in Step S77 satisfy the layout constraint or not (Step S78).

More specifically, the constraint judgment unit 82 makes a judgment as to whether the congestion degree of the routing obtained in Step S77 is within a range of the predetermined congestion degree of the routing or not, or a judgment as to whether the area of a dead space obtained in Step S77 is within a range of the predetermined area of a dead space or not. Note here that although the judgment is conducted for both of the congestion degree of the routing and the area of a dead space in Embodiment 8, the judgment may be made for one of them only.

As a result of the judgment, if the layout constraint is satisfied, the scheduling unit 83 performs the allocation to the selected memories and performs the scheduling (Step S79). Unlike Embodiment 7, in Embodiment 8, the scheduling in Step S79 is performed by using the access time of the memories obtained from the layout in Step S77.

On the other hand, if the layout constraint is not satisfied, the memory selection unit 81 selects a memory again (Step S76). In Step S76 of this case, a selectable memory list is used so as to exclude the already selected memories.

Then, after the scheduling in Step S79 is completed, the constraint judgment unit 82 specifies memory cells corresponding to the selected memory (memory M72) similarly to Step S68 shown in FIG. 35 (Step S80).

Following this, similarly to Step S69 shown in FIG. 35, the constraint judgment unit 82 calculates the delay time in each of the specified memory cells, and makes a judgment as to whether the memory cells whose calculated delay time is within a range of the delay constraint time are present or not (Step S81).

Herein, in Embodiment 8, the delay time in the selected memory is calculated by adding the access time of the memory that is obtained from the layout in Step S77 to the access time of the memory that is specified from the library for LSI design. Therefore, the accuracy in the calculation of the access time of the memory cell can be enhanced.

As a result of the judgment, if memory cells whose calculated delay time is within a range of the delay constraint time are present, the constraint judgment unit 82 selects the memory cell minimizing memory access time (Step S82). Thereafter, similarly to the example of Embodiment 1 shown in FIG. 2, a logic circuit is generated (Step S8) so as to finish the procedure.

On the other hand, as a result of the judgment, if memory cells whose calculated delay time is within a range of the delay constraint time are not present, Step S76 is executed again. Step S76 of this case is executed while excluding the firstly selected memory from the selectable memory list.

As stated above, according to Embodiment 8, the layout is performed, and based on the layout information obtained from these procedures, the allocation to the memories can be performed. That is, according to Embodiment 8, accurate information concerning the access time can be obtained based on the physical layout information of the memory and the circuit connected thereto. Furthermore, consideration can be given to the possibility of the routing and the layout area efficiency. Therefore, optimum memories can be allocated for the physical mounting.

In this way, according to the high level synthesis apparatuses and the high level synthesis methods of the present invention, a memory having an optimum bit width depending on the operation described in a behavior level circuit can be selected and the frequency of memory access can be optimized.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high level synthesis method by which a variable described in a behavior level circuit is allocated to a memory so as to generate a logic circuit, comprising the steps of:
   (a) calculating a number of referencing of the variable in the behavior level circuit;
   (b) extracting a bit width of the variable and selecting a plurality of memories capable of data transferring of the extracted bit width;
   (c) calculating a sum of a frequency of memory access for each of the plurality of memories selected in the step (b) when the variable is allocated thereto, the calculation being performed based on the number of referencing and the bit width of the variable; and
   (d) selecting as a target for allocating the variable a memory that minimizes the sum of the frequency of memory access calculated in the step (c).

2. The high level synthesis method according to claim 1, further comprising a step of: integrating a plurality of variables included in a plurality of array variables or structure variables described in the behavior level circuit so as to generate a new variable,
   wherein the steps (a) to (d) are executed for the new variable.

3. The high level synthesis method according to claim 2, wherein the plurality of variables are variables described in the same section in the behavior level circuit.

4. The high level synthesis method according to claim 3, further comprising steps of:
   before executing the step (a), allocating all variables described in the behavior level circuit each to a different memory and performing scheduling of execution cycles in the behavior level circuit; and
   specifying an execution cycle in which the array variables or the structure variables are accessed based on a result of the scheduling, judging that variables that are accessed within a range of a predetermined frequency of an execution cycle are variables described in the same section and judging that variables that are not accessed within the range are variables that are not described in the same section.

5. The high level synthesis method according to claim 3, wherein the same section is defined by a repetition processing in the behavior level circuit, the method further comprising the step of: specifying variables described in the same section among a plurality of variables included in the same array variable or structure variable described in the behavior level circuit.

6. The high level synthesis method according to claim 2, wherein the plurality of variables are variables that are not described in the same section in the behavior level circuit.

7. The high level synthesis method according to claim 2, further comprising steps of:
   performing dependency analysis concerning array variables or structure variables described in the behavior level circuit so as to calculate a distance vector between arbitrary variables out of the array variables or the structure variables, and
   specifying the plurality of variables based on the calculated distance vector.

8. The high level synthesis method according to claim 1, further comprising a step of: separating an array variable or a structure variable described in the behavior level circuit so as to generate a new variable that is made up of a plurality of variables included in a resultant of the separation,
   wherein the steps (a) to (d) are executed for the new variable.

9. The high level synthesis method according to claim 1, further comprising steps of:
   integrating a plurality of variables included in a plurality of array variables or structure variables described in the behavior level circuit so as to generate a new array variable or structure variable, and
   separating the new array variable or structure variable so as to generate a new variable that is made up of a plurality of variables included in a resultant of the separation,
   wherein the steps (a) to (d) are executed for the new variable.

10. The high level synthesis method according to claim 1, further comprising a step of: setting a variable group made up of variables described in the behavior level circuit,
    wherein, in the step (b), a bit width of the variable group and a bit width of a variable that does not make up the variable group are extracted, and the plurality of memories are selected for each of the variable group and the variable that does not make up the variable group.

11. The high level synthesis method according to claim 10, wherein the variables making up the variable group are variables described in the same section in the behavior level circuit.

12. The high level synthesis method according to claim 11, further comprising steps of:
    before executing the step (a), allocating all variables described in the behavior level circuit each to a different memory and performing scheduling of execution cycles in the behavior level circuit; and
    specifying an execution cycle in which each of the variables is accessed based on a result of the scheduling, judging that variables that are accessed within a range of a predetermined frequency of an execution cycle are variables described in the same section and judging that variables that are not accessed within the range are variables that are not described in the same section.

13. The high level synthesis method according to claim 11, wherein a plurality of the variable groups are configured, and
    the number of variables making up at least one variable group is different from the number of variables making up another variable group.

14. The high level synthesis method according to claim 10, wherein the variables making up the variable group are variables that are not described in the same section in the behavior level circuit.

15. The high level synthesis method according to claim 10, wherein the plurality of memories selected for the variable group each have a different bit width.

16. The high level synthesis method according to claim 10, wherein the number of the variable groups that can be configured is set beforehand.

17. The high level synthesis method according to claim 1, further comprising a step of: before executing the step (c), allocating the variable to the memory selected in the step (b) and performing scheduling of execution cycles in the behavior level circuit,
    wherein, in the step (c), a judgment is made based on a result of the scheduling as to whether an operation processing that can be executed in parallel with the memory access is present or not, and if the operation processing is present, the sum of the frequency of memory access is corrected.

18. The high level synthesis method according to claim 17, further comprising steps of:

extracting a repetition processing described in the behavior level circuit and analyzing a dependence of variables included in the repetition processing; and interchanging an execution order within the repetition processing based on a result of the analysis of the dependence so that the variables to be referred to at the same time can be executed in the same execution cycle.

19. The high level synthesis method according to claim 1, further comprising steps of:

before executing the step (c), allocating the variable to the memory selected in the step (b) and performing scheduling of execution cycles in the behavior level circuit; and after executing the step (d), displaying an access pattern to the selected memory, the access pattern being obtained from the scheduling.

20. The high level synthesis method according to claim 19, wherein continuous accesses of a predetermined frequency or more to the same memory are extracted from a result of the scheduling, and an access pattern showing the accesses is displayed.

21. The high level synthesis method according to claim 19, wherein a plurality of memories that are not accessed in the same execution cycle are extracted from a result of the scheduling, and an access pattern showing an access condition to the extracted plurality of memories is displayed.

22. The high level synthesis method according to claim 1, further comprising a step of: specifying a plurality of memory cells corresponding to the selected memories and selecting among the plurality of memory cells a memory cell satisfying a predetermined condition on a delay time in one execution cycle, wherein, in the case where the memory cell satisfying the predetermined condition on a delay time in one execution cycle cannot be selected, the step (d) is executed again.

23. The high level synthesis method according to claim 22, further comprising a step of: allocating the variable to the selected memory and performing scheduling of execution cycles in the behavior level circuit, wherein the selection of the memory cell is performed by calculating a delay time in one execution cycle for each of the plurality of memory cells based on a result of the scheduling and an access time of each of the plurality of memory cells and by making a judgment as to whether the calculated delay time satisfies the predetermined condition or not.

24. The high level synthesis method according to claim 22, further comprising a step of: after executing the step (d), allocating the variable to the selected memory and performing layout, whereby layout information specifying at least an arranged position of the selected memory and an arranged position of a circuit connected with the selected memory is generated, wherein an access time of each of the plurality of memory cells is determined from the layout information.

25. The high level synthesis method according to claim 1, further comprising steps of:

after executing the step (d), allocating the variable to the selected memory and performing layout, whereby layout information specifying at least an arranged position of the selected memory and an arranged position of a circuit connected with the selected memory is generated;

determining at least one of an access time of the selected memory, a congestion degree of routing and an area of a dead space based on the layout information; and in the case where the access time is determined, performing scheduling of execution cycles in the behavior level circuit using the access time.

26. The high level synthesis method according to claim 25, further comprising a step of: in the case where the congestion degree of the routing is determined, making a judgment as to whether the congestion degree of the routing satisfies a predetermined condition or not, wherein if the congestion degree of the routing does not satisfy the predetermined condition, the step (d) is executed again with respect to a memory other than the selected memory.

27. The high level synthesis method according to claim 25, further comprising a step of: in the case where the area of a dead space is determined, making a judgment as to whether the area of a dead space satisfies a predetermined condition or not, wherein if the area of a dead space does not satisfy the predetermined condition, the step (d) is executed again with respect to a memory other than the selected memory.

28. A high level synthesis apparatus that allocates a variable described in a behavior level circuit to a memory so as to generate a logic circuit, comprising:

a reference number calculation unit that calculates the number of referencing of the variable in the behavior level circuit;

a bit width extraction unit that extracts a bit width of the variable and selects a plurality of memories capable of data transferring of the extracted bit width; and a memory selection unit that calculates a sum of a frequency of memory access for each of the selected plurality of memories when the variable is allocated thereto, the calculation being performed based on the number of referencing and the bit width of the variable, and selects as a target for allocation a memory that minimizes the calculated sum of the frequency of memory access.

29. A computer program product comprising a program recorded in a recording medium, the program making a computer allocate a variable described in a behavior level circuit to a memory and generate a logic circuit, wherein the program contains commands that make the computer execute steps of:

(a) calculating the number of referencing of the variable in the behavior level circuit;

(b) extracting a bit width of the variable and selecting a plurality of memories capable of data transferring of the extracted bit width;

(c) calculating a sum of the frequency of memory access for each of the plurality of memories selected in the step (b) when the variable is allocated thereto, the calculation being performed based on the number of referencing and the bit width of the variable; and (d) selecting as a target for allocating the variable a memory that minimizes the sum of the frequency of the memory access calculated in the step (c).

* * * * *